United States Patent
Higashi et al.

(10) Patent No.: US 12,048,900 B2
(45) Date of Patent: Jul. 30, 2024

(54) INORGANIC STRUCTURE BODY, DEVICE, AND METHOD FOR MANUFACTURING INORGANIC STRUCTURE BODY

(71) Applicant: KABUSHIKI KAISHA TOYOTA CHUO KENKYUSHO, Nagakute (JP)

(72) Inventors: Shougo Higashi, Nagakute (JP); Keisuke Shigetoh, Nagakute (JP); Atsushi Beniya, Nagakute (JP); Nobuhiko Muramoto, Nagakute (JP); Kazutaka Nishikawa, Nagakute (JP); Shin Tajima, Nagakute (JP); Ryoji Asahi, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 1190 days.

(21) Appl. No.: 16/643,356

(22) PCT Filed: Sep. 7, 2018

(86) PCT No.: PCT/JP2018/033244
§ 371 (c)(1),
(2) Date: Feb. 28, 2020

(87) PCT Pub. No.: WO2019/049996
PCT Pub. Date: Mar. 14, 2019

(65) Prior Publication Data
US 2020/0254395 A1 Aug. 13, 2020

(30) Foreign Application Priority Data

Sep. 7, 2017 (JP) .................................. 2017-172342
Apr. 4, 2018 (JP) .................................. 2018-072715

(51) Int. Cl.
*B01D 69/12* (2006.01)
*B01D 67/00* (2006.01)
(Continued)

(52) U.S. Cl.
CPC ....... *B01D 69/12* (2013.01); *B01D 67/00043* (2022.08); *B01D 69/1071* (2022.08);
(Continued)

(58) Field of Classification Search
None
See application file for complete search history.

(56) References Cited

U.S. PATENT DOCUMENTS

| 6,667,099 B1 | 12/2003 | Greiner et al. |
| 2011/0195860 A1 | 8/2011 | Shi et al. |

(Continued)

FOREIGN PATENT DOCUMENTS

| JP | 2010-97914 A | 4/2010 |
| KR | 100783490 B1 | 12/2007 |

(Continued)

OTHER PUBLICATIONS

Nov. 27, 2018 International Search Report issued in International Patent Application No. PCT/JP2018/033244.
(Continued)

*Primary Examiner* — Arti Singh-Pandey
(74) *Attorney, Agent, or Firm* — Oliff PLC

(57) ABSTRACT

An inorganic structure body has a free-standing structure including a fibrous member and/or a shell. The fibrous member and/or the shell include a metal and/or an inorganic material and have a three-dimensionally continuous configuration. The free-standing structure may have a structure that is based on a nonwoven fabric or a porous membrane used as a substrate.

17 Claims, 13 Drawing Sheets

(51) Int. Cl.

| | |
|---|---|
| *B01D 69/10* | (2006.01) |
| *B01D 71/02* | (2006.01) |
| *B01J 35/59* | (2024.01) |
| *B82Y 30/00* | (2011.01) |
| *B82Y 40/00* | (2011.01) |
| *C23C 14/00* | (2006.01) |
| *C23C 14/20* | (2006.01) |
| *C25B 1/04* | (2021.01) |
| *C25B 9/73* | (2021.01) |
| *D04H 1/4209* | (2012.01) |
| *F24S 70/25* | (2018.01) |

(52) U.S. Cl.
CPC ..... *B01D 71/0215* (2022.08); *B01D 71/0221* (2022.08); *B01D 71/0223* (2022.08); *B01D 71/02231* (2022.08); *B01D 71/02232* (2022.08); *B01D 71/024* (2013.01); *B01J 35/59* (2024.01); *C25B 1/04* (2013.01); *C25B 9/73* (2021.01); *D04H 1/4209* (2013.01); *B01D 2325/0283* (2022.08); *B01D 2325/10* (2013.01); *B82Y 30/00* (2013.01); *B82Y 40/00* (2013.01); *C23C 14/0005* (2013.01); *C23C 14/20* (2013.01); *F24S 70/25* (2018.05)

(56) References Cited

U.S. PATENT DOCUMENTS

| | | |
|---|---|---|
| 2017/0051419 A1 | 2/2017 | Jang et al. |
| 2018/0025842 A1 | 1/2018 | Muraoka et al. |

FOREIGN PATENT DOCUMENTS

| | | |
|---|---|---|
| KR | 10-2017-0022788 A | 3/2017 |
| WO | 2016/129589 A1 | 8/2016 |

OTHER PUBLICATIONS

M.K. Debe et al. "Structural Characteristics of a Uniquely Nanostructured Organic Thin Film". J. Vac. Sci. Technol. B, vol. 13, No. 3, May/Jun. 1995, pp. 1236-1241.

M.K. Debe. "Novel Catalysts, Catalysts Support and Catalysts Coated Membrane Methods". Handbook of Fuel Cells Fundamentals, Technology and Applications, vol. 3, 2003, pp. 576-578.

A. Bonakdarpour et al. "Studies of Transition Metal Dissolution From Combinatorially Sputtered, Nanostructured Pt1-XMX (M=Fe, Ni; $0 < x < 1$) Electrocatalysts for Pem Fuel Cells". Journal of the Electrochemical Society, vol. 152, No. 1, 2005, pp. A61-A72.

Ivo Safarik et al. "Magnetic Techniques for the Isolation and Purification of Proteins and Peptides". BioMagnetic Research and Technology, vol. 2, No. 7, 2004, pp. 1-17.

Ki-Bum Lee et al. "Multicomponent Magnetic Nanorods for Biomolecular Separations". Angew. Chem. Int. Ed., vol. 43, 2004, pp. 3048-3050.

In Su Lee et al. "Ni/NiO Core/Shell Nanoparticles for Selective Binding and Magnetic Separation of Histidine-Tagged Proteins". Journal of the American Chemical Society, vol. 128, 2006, pp. 10658-10659.

Youngmin Lee et al. "Synthesis and Activities of Rutile IrO2 and RuO2 Nanoparticles for Oxygen Evolution in Acid and Alkaline Solutions". The Journal of Physical Chemistry Letters, vol. 3, 2012, pp. 399-404.

Charles C. L. McCrory et al. "Benchmarking Heterogeneous Electrocatalysts for the Oxygen Evolution Reaction". Journal of the American Chemical Society, vol. 135, 2013, pp. 16977-16987.

Lin Zhou et al. "Self-Assembly of Highly Efficient, Broadband Plasmonic Absorbers for Solar Steam Generation". Sci. Adv., vol. 2, No. 4, Apr. 8, 2016, pp. 1-8.

Hadi Ghasemi et al. "Solar Steam Generation by Heat Localization". Nature Communications, vol. 5, No. 4449, 2014, pp. 1-7.

Mingwei Zhu et al. "Plasmonic Wood for High-Efficiency Solar Steam Generation". Advanced Energy Materials, vol. 8, No. 4, Feb. 5, 2018, pp. 1701028 (1-7).

Lin Zhou et al. "3D Self-Assembly of Aluminum Nanoparticles for Plasmon-Enhanced Solar Desalination". Nature Photonics, vol. 10, Jun. 2016, pp. 393-398.

Yang Liu et al. "Bioinspired Bifunctional Membrane for Efficient Clean Water Generation". Applied Materials and Interfaces, vol. 8, 2016, pp. 772-779.

Mar. 30, 2021 Office Action issued in Japanese Patent Application No. 2019-541024.

Nov. 9, 2021 Office Action issued in Japanese Patent Application No. 2019-541024.

Mar. 10, 2020 International Preliminary Report on Patentability issued in International Patent Application No. PCT/JP2018/033244.

catalyst vapor deposition

PVP nano – fiber
(100~200nm)

Polymer removal

Pure catalytic nonwoven fabric having several-nanoscale protrusions on surfaces $IrO_2$    PVP $IrO_2$ only Enlarged view
Nanoparticles having a diameter of 3 to 10 nm were connected together Enlarged view Example 12

Example 12

Target protein
His-Tag

Inorganic structure body

Magnet

Non-target proteins

Solvent

Target protein

Reference example 1

With His-Tag

Without His-Tag

INORGANIC STRUCTURE BODY, DEVICE, AND METHOD FOR MANUFACTURING INORGANIC STRUCTURE BODY

TECHNICAL FIELD

The present specification discloses an inorganic structure body, a device, and a method for manufacturing the inorganic structure body.

BACKGROUND ART

With regard to inorganic structure bodies, the related art discloses a method for forming organic pigment whiskers on a surface of a substrate by thermally vacuum vapor depositing an organic pigment on the surface of the substrate (see Non-Patent Literature 1, for example). Furthermore, Non-Patent Literature 2 discloses that such whiskers can also be used as a catalyst support layer in a fuel cell environment. In addition, Non-Patent Literature 3 discusses a stability of a polymer electrolyte fuel cell exhibited in an operating environment in a case where such whiskers are used as a catalyst support layer to support a metal catalyst, such as a Pt catalyst, thereon.

CITATION LIST

Non-Patent Literature

NPL 1: Debe, M. K. and Drubea, A. r., Structural characteristics of a uniquely nanostructured organic thin film, J. Vac. Sci. Technol. B13-3(1995)1236

NPL 2: M. K. Debe, in Handbook of Fuel Cells Fundamentals, Technology and Applications, W. Vielstich, A. Lamm, and H. A. Gasteiger, Editors, p. 576, Jhon Wiley & Sons, New York (2003)

NPL 3: Bonakdarpour, A. et. al., Studies of Transition Metal Dissolution from Combinatorially Sputtered, Nanostructured Pt1-xMx(M=Fe, Ni;0<x<1) Electrocatalysis for PEM Fuel Cells, J. Electrochem. Soc. 152(2005)A61-A72

SUMMARY OF INVENTION

Technical Problem

According to Non-Patent Literature 1 to 3, a nanostructure made of an element, such as Pt, can be produced by forming organic pigment whiskers on a surface of a substrate and depositing an element such as Pt on surfaces of the whiskers by sputtering or the like. However, this method requires that a special pigment that can be vacuum vapor deposited be thermally vapor deposited on a surface of a substrate and, therefore, has not been widely used. Furthermore, in films produced by using this method, interfaces exist between the whiskers and the material deposited on the surfaces, and therefore, there has been a problem in that the ratio of utilization of the deposited element is low.

The present disclosure is made in view of such problems, and a principal object of the present disclosure is to provide a new inorganic structure body, device, and method for manufacturing the inorganic structure body, the inorganic structure body having a free-standing structure that includes a metal and/or an inorganic material.

Solution to Problem

The present inventors diligently performed studies to achieve the object described above and discovered that a new inorganic structure body can be obtained by forming a metal and/or an inorganic material on a surface of a nonwoven fabric or a porous membrane, which is used as a substrate, and then removing the substrate. Consequently, the present inventors completed the inorganic structure body, the device, and the method for manufacturing the inorganic structure body of the present disclosure.

Specifically, according to the present disclosure, an inorganic structure body has a free-standing structure including at least one of a fibrous member and a shell, the at least one of the fibrous member and the shell including at least one of a metal and an inorganic material and having a three-dimensionally continuous configuration.

A device according to the present disclosure is a device in which the inorganic structure body described above is used as at least one of a catalyst layer and a filter.

According to the present disclosure, a method for manufacturing an inorganic structure body includes a forming step and a removing step. In the forming step, at least one of a metal and an inorganic material is formed on a surface of a substrate including a polymer, thereby forming, on the surface of the substrate, a free-standing structure that includes at least one of a fibrous member and a shell. The at least one of the fibrous member and the shell includes the at least one of the metal and the inorganic material and has a three-dimensionally continuous configuration. In the removing step, all or a portion of the substrate is removed.

Advantageous Effects of Invention

The present disclosure provides a new inorganic structure body, device, and method for manufacturing the inorganic structure body, the inorganic structure body having a free-standing structure that includes a metal and/or an inorganic material. For example, when a metal and/or an inorganic material is physically vapor deposited on a surface of a polymeric substrate, numerous nuclei of nanoparticles are formed on the surface of the substrate, and the particles grow. As a result, fibrous members and/or a shell constructed of aggregates of nanoparticles are formed on the surface of the substrate. When the physical vapor deposition is further continued, further nucleation and growth of nanoparticles occur repeatedly on the surface of the substrate. As a result, protruding structures constructed of nanoparticles having a particle diameter of 1 to 10 nm are formed on surfaces of the fibrous members and/or the shell. The resultant inorganic structure body has a three-dimensionally continuous configuration, and therefore, even after the substrate is removed, the free-standing structure is maintained. Inorganic structure bodies obtained in this manner are substantially free of substrate-nanoparticle interfaces. Accordingly, in cases where the inorganic structure body is used, for example, in a catalyst layer of a fuel cell, the ratio of utilization of the catalyst metal is improved. Furthermore, steps for recovery, cleaning, and drying of nanoparticles are unnecessary, and in addition, no equipment is necessary for safely handling nanoparticles as opposed to the case where nanoparticles are liquid-phase synthesized. Hence, the inorganic structure body can be produced easily compared with methods of the related art.

DESCRIPTION OF EMBODIMENTS

Figure 1:
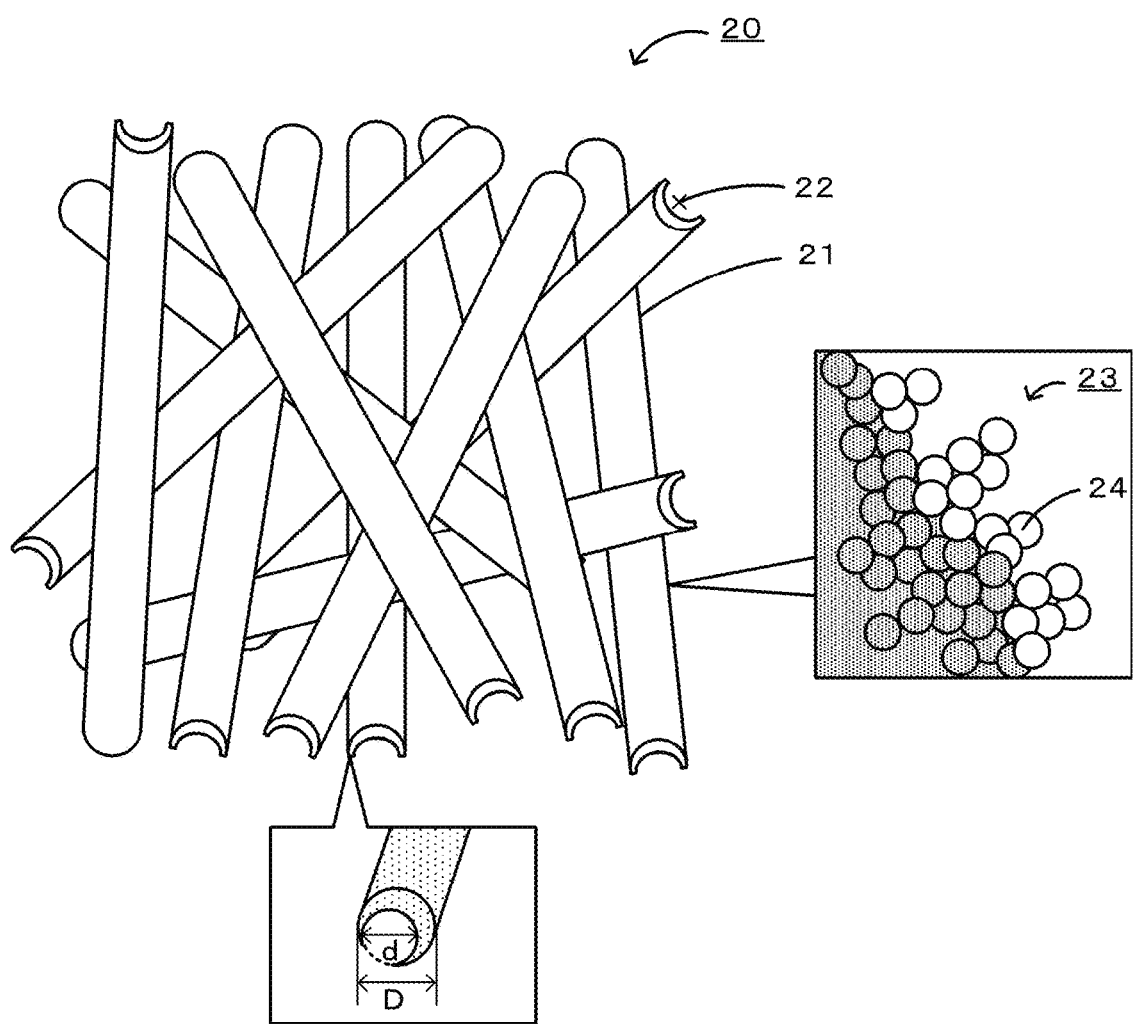
FIG. 1 is a diagram illustrating an exemplary general configuration of an inorganic structure body 20.

An embodiment of the present disclosure will be described in detail below.

[Inorganic Structure Body]

According to the present disclosure, an inorganic structure body has a free-standing structure including a fibrous member and/or a shell, the fibrous member and/or the shell including a metal and/or an inorganic material and having a three-dimensionally continuous configuration. In the inorganic structure body, the fibrous member and the shell may be constructed of aggregates of nanoparticles that are made of a metal and/or an inorganic material. Furthermore, the inorganic structure body may be an inorganic nanostructured fabric having a free-standing structure that includes a shell, the shell being constructed of aggregates of nanoparticles that are made of a metal and/or an inorganic material, the shell having a three-dimensionally continuous configuration. As used herein, the term "nanoparticles" refers to particles having a particle diameter of 1 nm or greater and 10 nm or less. The nanoparticles may be crystalline or amorphous. The material for the nanoparticles is not particularly limited, and an optimal material may be selected in accordance with the purpose.

The free-standing structure may include at least one of the following (a) to (d), for example:
(a) metal nanoparticles containing one of a noble metal, a main group metal, and a transition metal;
(b) metal nanoparticles made of an alloy containing at least one of a noble metal, a main group metal, and a transition metal;
(c) metal compound nanoparticles made of a metal oxide, a metal sulfide, a metal nitride, a metal carbide, a metal phosphide, or a metal iodide; and
(d) carbon nanoparticles.

The noble metal may be one or more noble metals, examples of which include Au, Ag, Pt, Pd, Rh, Ir, Ru, and Os. Furthermore, the main group metal may be one or more main group metals, examples of which include Sn, Al, Mg, Ti, V, and Zn. Of these, Sn is preferable because of its high electrical conductivity. Furthermore, the transition metal may be one or more transition metals, examples of which include Cu, Fe, Co, Ni, Mn, and Mo. Of these, Cu is preferable because of its high electrical conductivity.

Examples of the alloy containing a metal include Pt—Fe alloys, Pt—Ni alloys, Pt—Co alloys, Ir—Fe alloys, Ir—Co alloys, and Ir—Ni alloys. Examples of the metal oxide include iridium oxide, copper oxide, iron oxide, nickel oxide, manganese oxide, and cobalt oxide. Examples of the metal sulfide include iridium sulfide, copper sulfide, iron sulfide, nickel sulfide, cobalt sulfide, and molybdenum sulfide. Examples of the metal nitride include copper nitride, iron nitride, nickel nitride, manganese nitride, and cobalt nitride. Examples of the metal carbide include iridium carbide, silicon carbide, iron carbide, copper carbide, cobalt carbide, and manganese carbide. Examples of the metal phosphide include iridium phosphide, iron phosphide, copper phosphide, cobalt phosphide, and manganese phosphide. Examples of the metal iodide include iridium iodide, iron iodide, copper iodide, cobalt iodide, and manganese iodide. The inorganic structure body may be a body including nanoparticles of one of the materials mentioned above or two or more thereof. Examples of the inorganic material include solids formed of an inorganic nonmetal, such as carbon or Si.

According to the present disclosure, the term "fibrous member" refers to, for example, an object formed on a surface of a fiber, which is used as a substrate, and having a shape based on the fiber. Examples of the fibrous member include tubular nanowires and semi-tubular nanowires. The fibrous member may have a thickness (diameter) of less than or equal to 200 nm, for example. Alternatively, the fibrous member may have a thickness of less than or equal to 1 μm in the case where a protruding structure formed of particles is to be realized. Furthermore, according to the present disclosure, the term "shell" refers to a sheet-shaped (shell-shaped) structure in which dimensions in a horizontal direction (x-axis direction and/or y-axis direction) are larger than a dimension in a thickness direction (z-axis direction). The phrase "shell constructed of aggregates of nanoparticles" means that a dimension in a thickness direction (z-axis direction) of the shell has a finite value and does not necessarily mean that more than one nanoparticle layer is stacked in the thickness direction. That is, the following cases are possible. The shell may be made of a single nanoparticle layer in which the nanoparticles are disposed in an x-y plane. The shell may be made of a stack of two or more nanoparticle layers.

According to the present disclosure, the inorganic structure body may be produced by forming a metal and/or an inorganic material on a surface of a polymer-containing substrate. The inorganic structure body includes a fibrous member and/or a shell formed to follow the surface topography of the substrate. When the surface of the substrate is microscopically flat, the shell also becomes microscopically flat. In general, however, the surface of a substrate has microscopic or macroscopic irregularities, and in addition, during physical vapor deposition, some of the atoms travel to the back side of the substrate. As a result, the fibrous member and the shell have microscopically or macroscopically curved portions.

According to the present disclosure, the inorganic structure body has a free-standing structure including a fibrous member and/or a shell, the fibrous member and/or the shell having a three-dimensionally continuous configuration. The term "free-standing structure" refers to a structure that is sufficiently strong to be handled. The phrase "the fibrous member and/or the shell having a three-dimensionally continuous configuration" means that a dimension in a thickness direction (z-axis direction) of the inorganic structure body has a finite value and does not necessarily mean that the inorganic structure body is a joined body in which a plurality of fibrous members and/or shells are joined together. That is, the following cases are possible. The inorganic structure body may be made of a single fibrous member or a single shell. The inorganic structure body may be a joined body in which a plurality of fibrous members and/or shells are joined together three-dimensionally. Configurations for the inorganic structure body include the following: a configuration in which a macroscopically flat surface (surface having an infinite radius of curvature) is present; and a configuration in which a curved surface is present.

According to the present disclosure, the inorganic structure body may be formed by physical vapor deposition of a metal and/or an inorganic material onto a surface of a polymeric substrate. In the case where the surface of a substrate is microscopically and macroscopically formed of a single surface, the inorganic structure body may be formed of a single shell. On the other hand, in the case where the surface of a substrate is formed of an assembly of a plurality of curved surfaces, such as in the case of a nanowire nonwoven fabric, the inorganic structure body is typically formed of an assembly of a plurality of fibrous members having a curve-shaped surface.

In the inorganic structure body of the present disclosure, the free-standing structure may include, on a surface of the free-standing structure, protruding structures that include the metal and/or the inorganic material and which have a diameter of 3 nm or greater and 10 nm or less. For example, when a metal and/or an inorganic material are physically vapor deposited on a surface of a polymer substrate, numerous nuclei of nanoparticles are formed on the surface of the substrate, and the particles grow. When the physical vapor deposition is further continued, further nucleation and growth of nanoparticles occur repeatedly on the surfaces of the fibrous member and/or the shell. As a result, protruding structures constructed of nanoparticles are formed on the surfaces of the fibrous member and/or the shell.

The term "protruding structure" refers to a protruding object having a conical or pyramidal exterior, such as a pyramid or a cone. The phrase "diameter of protruding structures" refers to the maximum diameter of the protrusion (for example, in the case of a cone, the diameter of the bottom surface). The diameter and number of the protruding structures can be controlled with vapor deposition conditions. In general, as the number of protruding structures having small diameters increases, the specific surface area of the inorganic structure body increases. By optimizing the vapor deposition conditions, protruding structures constructed of nanoparticles and having a diameter of 3 nm or greater and 10 nm or less can be formed on the surfaces of the fibrous member and/or the shell.

According to the present disclosure, the inorganic structure body may further include a support portion made of a polymer, the support portion supporting at least a portion of the free-standing structure (a fibrous member and/or a shell). In the inorganic structure body of the present disclosure, after a metal and/or an inorganic material are formed on a surface of a polymeric substrate, the substrate, typically, is completely removed. However, a portion of the polymer for partially supporting the fibrous member and/or the shell may be retained. However, if an excessive amount of the polymer is retained, relatively large quantities of polymer-nanoparticle interfaces may remain, which may reduce the ratio of utilization of the nanoparticles. In terms of achieving a high utilization ratio, it is preferable that a polymer retention ratio be less than or equal to 20 mass %. The retention ratio is preferably less than or equal to 10 mass % and more preferably less than or equal to 5 mass %. Here, the polymer retention ratio is the value determined by equation (1) below. In the equation, $W_0$ is the mass per unit area of the inorganic structure body immediately after physical vapor deposition; W is the mass per unit area of the inorganic structure body after removal of the polymer used as a template, the polymer being removed by using a solvent that is capable of dissolving the polymer; and $W_m$ is the mass per unit area of the deposition material that forms the inorganic structure body. Note that $W_m$ can be estimated from the amount of physical vapor deposition.

$$\text{Polymer retention ratio} = (W - W_m) \times 100 / (W_0 - W_m) \quad (1)$$

According to the present disclosure, the inorganic structure body takes any of a variety of forms depending on the structure of the substrate used. For example, in the case where a nanowire nonwoven fabric is used as the substrate, and a metal and/or an inorganic material are physically vapor deposited on one side of the nonwoven fabric, the resulting free-standing structure is a nonwoven fabric structure (nanostructured fabric) including fibrous members made of semi-tubular nanowires, the fibrous members constituting a three-dimensionally continuous configuration. On the other hand, in the case where a nanowire nonwoven fabric is used as the substrate, and a metal and/or an inorganic material is physically vapor deposited on both sides of the nonwoven fabric, the resulting free-standing structure is a nonwoven fabric structure including fibrous members made of tubular nanowires, the fibrous members constituting a three-dimensionally continuous configuration. The term "nonwoven fabric structure" refers to a structure that results when the substrate is a nonwoven fabric and which has a shape that follows the structure of the nonwoven fabric used as the substrate.

In the case where a polymer porous membrane having pores is used as the substrate, and a metal and/or an inorganic material is physically vapor deposited on a surface of the substrate, the resultant is a porous membrane structure formed of a shell having pores, the shell having a three-dimensionally continuous configuration. The term "porous membrane structure" refers to a structure that results when the substrate is a porous membrane and which has a shape that follows the structure of the porous membrane used as the substrate. In this free-standing structure, the pores may have a radius of curvature of 20 nm or greater and 200 nm or less.

In the inorganic structure body, the free-standing structure may have flexibility. For example, in the case where the inorganic structure body is formed from a metal or an alloy, the inorganic structure body may have flexibility as with a metal or an alloy, and hence can be handled easily.

FIG. 1 is a diagram illustrating an exemplary general configuration of an inorganic structure body 20. The inorganic structure body 20 has a free-standing structure in which fibrous members 21 constitute a three-dimensionally continuous configuration. The fibrous members 21 have substrate spaces 22, which are formed as a result of removal of the substrate fibers. Furthermore, referring to the enlarged view of the fibrous members 21, it is seen that protruding structures 23, which have a diameter of 3 nm or greater and 10 nm or less, are formed on a surface of the fibrous members 21. The fibrous members 21 and the protruding structures 23 are constructed of aggregates of nanoparticles 24, which contain one or more of a noble metal, a main group metal, and a transition metal. The inorganic structure body 20, which has such a configuration, has flexibility and hence can be handled easily, and in addition, because of the large surface area, enables an increase in the ratio of utilization of nanoparticles.

An average diameter of the fibrous members 21 is preferably greater than or equal to 10 nm and more preferably greater than or equal to 50 nm or may be greater than or equal to 100 nm, for example. The average diameter of the fibrous members 21 is preferably less than or equal to 200 nm and more preferably less than or equal to 150 nm or may be less than or equal to 100 nm, for example. In this case, a diameter of the substrate spaces 22, that is, an average diameter of the substrate fibers, is preferably greater than or equal to 5 nm and more preferably greater than or equal to 40 nm or may be greater than or equal to 80 nm, for example. The average diameter of the substrate spaces 22 is preferably less than or equal to 180 nm and more preferably less than or equal to 120 nm or may be less than or equal to 80 nm, for example. Alternatively, the average diameter of the fibrous members 21 is preferably greater than or equal to 200 nm and more preferably greater than or equal to 300 nm or may be greater than or equal to 500 nm, for example. The average diameter of the fibrous members 21 is preferably less than or equal to 800 nm and more preferably less than or equal to 600 nm or may be less than or equal to 500 nm, for example. In this case, the average diameter of the substrate spaces 22 is preferably greater than or equal to 180 nm and more preferably greater than or equal to 280 nm or may be greater than or equal to 480 nm, for example. The average diameter of the substrate spaces 22 is preferably less than or equal to 780 nm and more preferably less than or equal to 580 nm or may be less than or equal to 480 nm, for example. The average diameter of the substrate fibers is a major factor that determines the average diameter of the fibrous members 21. Smaller average diameters of the substrate fibers result in larger surface areas of the inorganic structure body 20. The average diameter of the substrate fibers and the average diameter of the fibrous members 21 may be appropriately selected in accordance with the intended use. For example, for catalyst applications, it is desirable to reduce the mass, and therefore, thinner and narrower configurations are preferable, and for battery material applications, thicker and heavier configurations are preferable. When it is assumed that the size of the nanoparticles 24, which form the fibrous members 21, is 3 nm to 4 nm, the average diameter of the fibrous members 21 can equal a value that is obtained by adding 6 nm or more to the size of the substrate fiber (substrate space 22). Note that in cases where the fibrous member has a shape in which a portion is missing, such as a crescent shape, as viewed in cross section, the diameter of the fibrous member is the diameter of the imaginary circle, which is a circle including the missing portion (see a diameter D in FIG. 1). The average diameter is determined by performing SEM examinations for a predetermined number of fields of view (e.g., five fields of view), determining the diameter of each of the fibers, and obtaining the average.

[Device]

A device according to the present disclosure is a device in which the inorganic structure body described above is used as one or more of a catalyst layer, a filter, an electrically conductive member, a protein recovery member, and a photothermal conversion member. Examples of such devices include the following:

(a) polymer electrolyte fuel cells in which the inorganic structure body is used as a catalyst layer;

(b) water electrolysis devices in which the inorganic structure body is used as a catalyst layer;

(c) filtration devices in which the inorganic structure body is used as a filter;

(d) power storage devices or drive devices in which the inorganic structure body is used as an electrode member, a current collection member, and/or an electrically conductive member;

(e) separation and recovery devices in which the inorganic structure body is used as a recovery member that selectively recovers a protein; and (f) photothermal conversion devices in which the inorganic structure body is used as a photothermal conversion member that absorbs light and converts the light to heat.

For example, in the case where the inorganic structure body is used as a catalyst layer of a catalytic reaction device, such as a polymer electrolyte fuel cell or a water electrolysis device, it is possible to employ a typical current collector and cell configuration. In this case, the inorganic structure body may be transferred to a surface of an electrolyte membrane or may be transferred to a surface of a gas diffusion layer made of a porous metal member or the like. Furthermore, in the case where the inorganic structure body is used in an electrode member or a current collection member of a power storage device (e.g., a secondary battery), the inorganic structure body may be transferred to the usage portion (e.g., a surface of an active material layer). Furthermore, in the case where the inorganic structure body is used in a drive device (e.g., a motor), the inorganic structure body may be transferred to the usage portion.

In the case where the device of the present disclosure is a device in which the inorganic structure body is included to serve as a recovery member for selectively recovering a protein, the inorganic structure body may contain, for example, one or more of Cu, Ni, Cr, and Zn to selectively recover a His-tagged protein. Of these, Cu and Ni are preferable. Documents describing separation and recovery of protein and peptide have been reported. Examples of such documents include BioMagnetic Research and Technology 04, 2:7, Angew. Chem. Int. Ed. 2004, 43, 3048-3050, and J. AM. Chem. Soc. 2006, 128, 10658-10659. Compared with the devices reported in these documents, the inorganic structure body provides a high recovery efficiency because of its large specific surface area and provides ease of handling because of its high flexibility due to the form of a nonwoven fabric, which are preferable. Furthermore, a device reported in the above-mentioned documents recovers metal particles by using magnetic force, whereas the inorganic structure body does not require recovery that utilizes magnetic force, because the inorganic structure body has a form such as a nonwoven fabric form. Hence, a metal other than magnetic metals can be used.

In the case where the device of the present disclosure is a device in which the inorganic structure body is included to serve as a catalyst member for electrolysis of water, the inorganic structure body may contain one or more of the following noble metals: Pt, Au, Ag, Ru, and Ir. Of these, Ir is preferable, and iridium oxide is more preferable. Examples of documents regarding electrolysis of water include J. Phys. Chem. Lett. 2012, 3, 399-404 and J. Am. Chem. Soc. 2013, 135, 16977-16987. In the inorganic structure body, an average diameter is preferably greater than or equal to 200 nm, more preferably greater than or equal to 300 nm, and even more preferably greater than or equal to 400 nm. Furthermore, the average diameter is preferably less than or equal to 800 nm, and more preferably less than or equal to 700 nm, and even more preferably less than or equal to 600 nm. When the average diameter is 200 nm or greater and 800 nm or less, the potential for electrolysis of water can be reduced, and therefore such an average diameter is preferable. The device may include a working electrode for which the inorganic structure body is provided, a counter electrode that faces the working electrode, and a container for storing an aqueous solution. When the inorganic structure body is a nanostructured fabric, attachment and detachment to and from the working electrode are easy, and thus ease of handling is provided. Thus, such an inorganic structure body is preferable.

In the case where the device of the present disclosure is a device in which the inorganic structure body is included to serve as a photothermal conversion member for absorbing light and converting the light to heat, the inorganic structure body may contain one or more of Ag and Cu. The inorganic structure body may contain Ag or may contain Cu. It is more preferable that the inorganic structure body contain Ag and Cu. This is because photothermal conversion characteristics can be further improved. It is more preferable that the inorganic structure body have one or more multi-layer structures including one or more Ag layers and Cu layers stacked on top of one another, for example. It is preferable that two or more such multi-layer structures are present, and it is more preferable that three or more such multi-layer structures are present. When three or more such multi-layer structures are present, sufficient photothermal conversion characteristics can be provided.

Furthermore, according to the present disclosure, the device may be a liquid evaporator including the photothermal conversion device described above. The liquid evaporator may include the inorganic structure body, a support body, and a container. The inorganic structure body is a photothermal conversion member for absorbing light and converting the light to heat. The support body is a component having water absorbing properties and thermal insulation properties. A first surface of the support body is in contact with the inorganic structure body, and a second surface of the support body is in contact with a liquid stored in the container. It is preferable that the support body be a component that floats on a liquid. Examples of the support body include wood bodies and styrofoam bodies. This liquid evaporator evaporates liquid by using heat converted by the inorganic structure body. Furthermore, the liquid evaporator may include a condenser for condensing evaporated liquid. Such a device can distill liquid. Documents regarding liquid evaporators include Sci. Adv. 8 Apr. 2016, Vol. 2, No. 4, e1501227, Nature Communications volume 5, Article number: 4449 (2014), Adv. Energy Materials, Vol. 8, Issue 4, Feb. 5, 2018, 1701028, and Nature Photonics volume 10, pages 393-398 (2016). In devices of the present disclosure, the inorganic structure body used is a nanostructured fabric or the like. This is preferable because a high photothermal conversion efficiency is achieved, and ease of handling is provided.

[Method for Manufacturing Inorganic Structure Body]

According to the present disclosure, a method for manufacturing the inorganic structure body includes a forming step and a removing step. In the forming step, a free-standing structure including a metal and/or an inorganic material is formed on a surface of a substrate. In the removing step, all or a portion of the substrate is removed.

[Forming Step]

In this step, a metal and/or an inorganic material is formed on a surface of a polymer-containing substrate, thereby forming, on the surface of the substrate, a free-standing structure that includes a fibrous member and/or a shell, the fibrous member and/or the shell including the metal and/or the inorganic material and having a three-dimensionally continuous configuration. In this step, the metal and/or the inorganic material may be physically vapor deposited onto a surface of a substrate.

A polymer is used as the substrate. In the case where a polymer is used as the substrate, nucleation and growth of nanoparticles proceed relatively easily on a surface of the substrate during formation of the fibrous member and/or the shell. The composition of the polymer used as the substrate is not particularly limited. To facilitate removal of the substrate, however, it is preferable that the substrate be a solvent-soluble polymer. Examples of solvent-soluble polymers include polyethersulfone (PES), polyvinylidene fluoride (PVDF), polyvinyl pyrrolidone (PVP), polyethylene (PE), polypropylene (PP), polyester, polyvinyl alcohol (PVA), polyacrylonitrile (PAN), polyethylene oxide (PEO), polyacrylate, and polypropylene oxide.

The structure of the substrate is not particularly limited, and an optimal structure may be selected in accordance with the purpose. According to the present disclosure, the inorganic structure body has a structure that has the surface topography of the substrate transferred thereon. Accordingly, by using a polymer having a nano-sized structure for the substrate, a free-standing film having a nano-sized structure can be manufactured. Examples of the substrate include the following:

(a) nanowire nonwoven fabrics produced by electrospinning or the like;
(b) porous membranes having pores that have a radius of curvature of 20 nm or greater and 200 nm or less (a so-called "membrane filter"); and
(c) porous membranes made of polystyrene particles or the like and having an opal structure.

The polymer nonwoven fabric (substrate nonwoven fabric) to be used as the substrate can be produced by electrospinning. A fiber diameter of the substrate nonwoven fabric may be, for example, in the range of the diameter of the substrate spaces described above. The fiber diameter of the substrate nonwoven fabric can be adjusted with the polymer concentration of the solution that is used for the electrospinning, the electric field, the solution feed rate, or the like, for example.

In this step, the method for forming the fibrous member and/or the shell is not particularly limited, but physical vapor deposition may be used. Examples of the method for physical vapor deposition include sputtering methods and pulse laser deposition (PLD) methods. In the case where a metal and/or an inorganic material are physically vapor deposited on a surface of a substrate, the physical vapor deposition may be performed on one side of the substrate or on both sides of the substrate. For example, in the case where a polymer nanowire nonwoven fabric is used as the substrate, by performing physical vapor deposition exclusively on one side of the nanowire nonwoven fabric, a metal or an inorganic material nonwoven fabric structure made of semi-tubular nanowires can be obtained. Semi-tubular nanowires have a larger specific surface area than tubular nanowires and rod-shaped nanowires. Accordingly, for example, in the case where semi-tubular nanowires are used in a catalyst layer of a catalytic reaction device, the ratio of utilization of the metal and/or the inorganic material is increased. The conditions for the physical vapor deposition are not particularly limited, and optimal conditions may be selected in accordance with the purpose. In general, the longer the vapor deposition time, the larger the thickness of the fibrous member and/or the shell. Furthermore, physical vapor deposition methods enable the amount of vapor deposition to be controlled at an atomic level. Accordingly, by optimizing the vapor deposition conditions, it is also possible to form protruding structures having a diameter of 3 nm or greater and 10 nm or less on the surface of the shell.

In this step, the metal that may be used is one or more metals, examples of which include noble metals, main group metals, transition metals, and alloys thereof. Furthermore, the inorganic material that may be used is one or more inorganic materials, which include metal oxides, metal sulfides, metal nitrides, metal carbides, metal phosphides, and metal iodides. The noble metal may be one or more noble metals, examples of which include Au, Ag, Pt, Pd, Rh, Ir, Ru, and Os. Furthermore, the main group metal may be one or more main group metals, examples of which include Sn, Al, Mg, Ti, V, and Zn. Furthermore, the transition metal may be one or more transition metals, examples of which include Cu, Fe, Co, Ni, Mn, and Mo.

For example, in the case where an inorganic structure body for selectively recovering a His-tagged protein is produced, the metal to be used may be one or more of Cu, Ni, Zn, and Co. Cu and Ni are preferred as the metal to be used as a recovery member.

In the case where an inorganic structure body that serves as a catalyst member for electrolysis of water is produced, one or more of Pt, Au, Ag, Ru, and Ir may be used. As the metal to be used for electrolysis of water, Ir is preferable, and iridium oxide is more preferable. Furthermore, in the inorganic structure body that is used for electrolysis of water, the average diameter of the fibrous members is preferably greater than or equal to 200 nm, more preferably greater than or equal to 300 nm, and even more preferably greater than or equal to 400 nm. Furthermore, in the inorganic structure body that is used for electrolysis of water, the average diameter of the fibrous members is preferably less than or equal to 800 nm, more preferably less than or equal to 700 nm, and even more preferably less than or equal to 600 nm. When the average diameter is 200 nm or greater and 800 nm or less, the potential for electrolysis of water can be reduced, and therefore such an average diameter is preferable.

In the case where an inorganic structure body that serves as a photothermal conversion member for absorbing light and converting the light to heat is produced, the metal to be used may be one or more of Ag and Cu. In production of the photothermal conversion member, Ag may be used, or Cu may be used. It is more preferable that Ag and Cu be used. In particular, in production of the photothermal conversion member, it is more preferable to form one or more multi-layer structures including one or more Ag layers and Cu layers stacked on top of one another. In production of the photothermal conversion member, it is preferable to form two or more multi-layer structures including Ag layers and Cu layers and more preferably three or more multi-layer structures. When three or more such multi-layer structures are present, sufficient photothermal conversion characteristics can be provided.

[Removing Step]

In this step, a process for removing all or a portion of the substrate is performed, after a fibrous member and/or a shell is formed on the surface of the substrate. All of the substrate may be removed, or a portion of the substrate may be removed. To reduce the number of substrate-nanoparticle interfaces, it is preferable to remove all of the substrate. The method for removing the substrate is not particularly limited, and an optimal method may be selected in accordance with the type of substrate. For example, in the case where a solvent-soluble polymer is used as the substrate, it is preferable to remove the substrate by using a solvent. Examples of solvents that can dissolve a variety of polymers include dimethylformamide (DMF), N-methyl-2-pyrrolidone (NMP), solutions of $NaBH_4$ (solvent: a 1:1 mixture of water and ethanol), chloroform, acetone, alcohols, such as methanol and ethanol, water, 2-methyltetrahydrofuran, dioxane, dimethyl sulfoxide, sulfolane, and nitromethane.

Figure 2A:
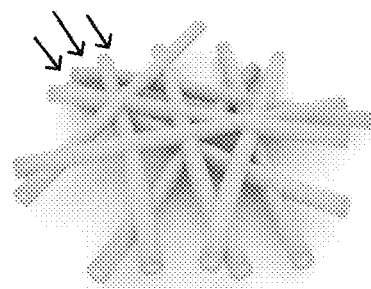
FIG. 2A to 2C present schematic illustrations of a method for manufacturing an inorganic structure body (nonwoven fabric structure) of the present disclosure.
Figure 2B:
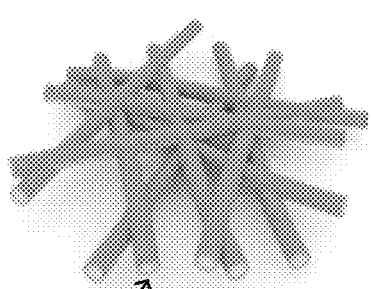
Figure 2C:
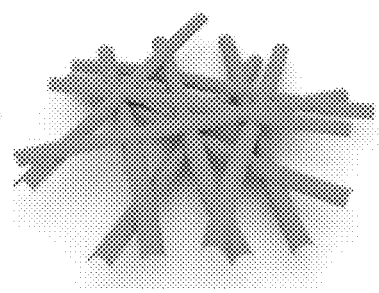

FIG. 2A to 2C present schematic illustrations of the method for manufacturing an inorganic structure body (nonwoven fabric structure) of the present disclosure. FIG. 2A is a schematic illustration of a nonwoven fabric made of PVP nanowires having a diameter of 100 to 200 nm. By using such a nonwoven fabric as a substrate and physically vapor depositing a metal and/or an inorganic material that serves as, for example, a catalyst (hereinafter also referred to as a "catalytic material") on a surface of the substrate, a composite body in which a shell made of the catalytic material is formed on the surface of the substrate can be obtained, as illustrated in FIG. 2B. Further, by removing the PVP nanowires from the obtained composite body, a nonwoven fabric (pure catalytic nonwoven fabric) including nanowires that are made of substantially only the catalytic material and constitute a three-dimensionally continuous configuration can be obtained, as illustrated in FIG. 2C. In this process, optimizing the conditions for the physical vapor deposition results in formation of several-nanoscale protrusions on surfaces of the nanowires.

When a metal and/or an inorganic material is physically vapor deposited on a surface of a polymeric substrate, numerous nuclei of nanoparticles are formed on the surface of the substrate, and the particles grow. As a result, fibrous members and/or a shell constructed of aggregates of nanoparticles are formed on the surface of the substrate. When the physical vapor deposition is further continued, further nucleation and growth of nanoparticles occur repeatedly on the surfaces of the fibrous members and/or the shell. As a result, protruding structures constructed of nanoparticles having a diameter of 1 to 10 nm are formed on surfaces of the fibrous members and/or the shell. The resultant fibrous members and/or shell have a three-dimensionally continuous configuration, and therefore, even after the substrate is removed, the free-standing structure is maintained. Inorganic structure bodies obtained in this manner are substantially free of substrate-nanoparticle interfaces. Accordingly, in cases where the inorganic structure body is used, for example, in a catalyst layer of a fuel cell, the ratio of utilization of the catalyst metal is improved. Furthermore, steps for recovery, cleaning, and drying of nanoparticles are unnecessary, and in addition, no equipment is necessary for safely handling nanoparticles as opposed to the case where nanoparticles are liquid-phase synthesized. Hence, the inorganic structure body can be produced easily compared with methods of the related art.

In nanocatalytic materials of the related art, nanoparticle-support body interfaces exist, and nanoparticles existing near the interfaces do not contribute to catalytic reactions. In contrast, according to the present disclosure, the inorganic structure body is free-standing, without requiring any support body, and therefore no nanoparticle-support body interfaces exist. Accordingly, using the inorganic structure body as a catalyst reduces loss of reaction area. Furthermore, by using, as the template, a polymer membrane in which pores have a radius of curvature of 20 to 200 nm or nanowires having a diameter of 20 to 200 nm, an inorganic structure body having such a structure transferred thereon can be obtained. Furthermore, physical deposition processes, such as sputtering, enable the amount of vapor deposition to be controlled at an atomic level. This makes it possible to form, on the outermost surface, protruding structures having a diameter of approximately 3 to 10 nm. In addition, the resultant inorganic structure body is highly homogeneous, and the manufacturing process is very simple compared with ink processes.

There are quite a few instances in which nanocatalysts, in a specific size range, exhibit a nonlinear catalytic effect, which is due to the size effect, that cannot be estimated from bulk materials. In the case where the manufacturing method described above is used, a search for an optimal catalyst size is facilitated.

By producing a fibrous member and/or a shell, which includes a desired metal and/or an inorganic material, on a surface of a free-standing substrate by using a physical vapor deposition method, such as a sputtering method, a free-standing film that follows the structure of the base can be obtained. Since the polymer is removed, no polymer that interferes with reaction exists, and the surface of the metal and/or the inorganic material becomes exposed. As a result, a high specific surface area is achieved, which increases catalytic activity per unit mass. In addition, in the case where a metal and/or an inorganic material are physically vapor deposited on a surface of a substrate made of a crystalline polymer and having a nanoscale curved surface, protrusions made of the metal and/or the inorganic material and having a diameter of several nanometers grow perpendicularly to the surface of the substrate. The inorganic structure body having such a structure provides a high specific surface area, that is, a surface having a large reaction area.

It will be apparent that the present disclosure is in no way limited to the above-described embodiments and can be implemented in a variety of forms within the technical scope of the present disclosure.

EXAMPLES

Examples are described below, which are examples in which inorganic structure bodies having a free-standing structure were produced specifically.

Preparation of Samples

Examples 1 and 2

A 4×4 cm piece of a PES membrane filter (trade name: Millipore PES) was cut, and a Pt film was formed on a surface of the membrane filter by using a sputtering method (forming step). The sputtering was performed in an Ar atmosphere by using an MC 1000 ion sputtering system, manufactured by Hitachi High-Technologies Corporation. Next, PES was removed by using DMF and NMP (removing step) to obtain an inorganic structure body having a free-standing structure made of only Pt. This was designated as Example 1. Furthermore, another inorganic structure body having a free-standing structure made of only Pt was obtained in a manner similar to that for Example 1 except that a PVDF membrane filter was used as the substrate. This was designated as Example 2.

Example 3

Figure 3A:
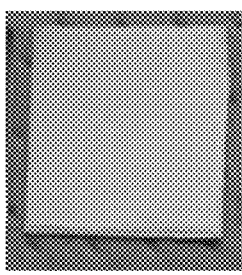
FIG. 3A to 3H present illustrations of a procedure for producing an $IrO_2$ nanowire nonwoven fabric (Example 3).
Figure 3B:
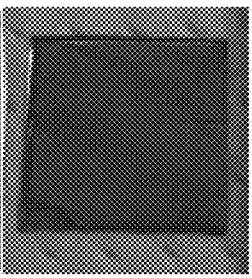
Figure 3C:
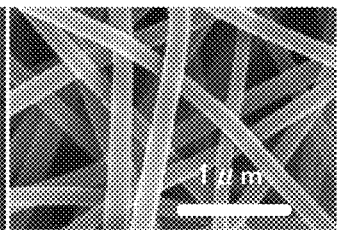
Figure 3D:
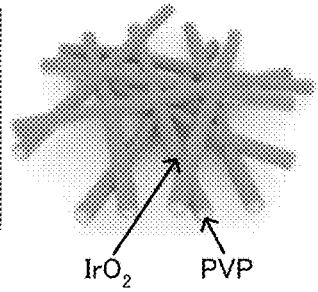
Figure 3E:
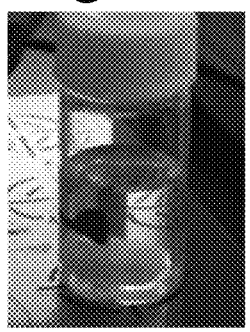
Figure 3F:
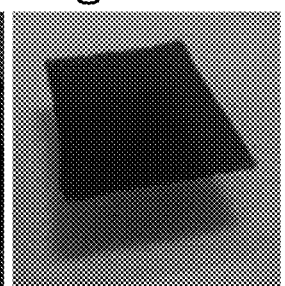
Figure 3G:
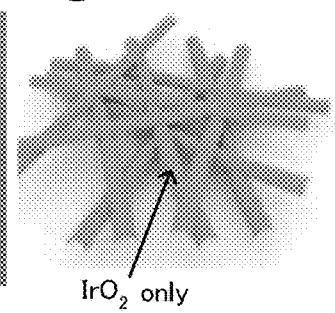
Figure 3H:
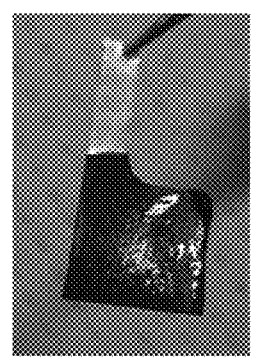

FIG. 3A to 3H present illustrations of a procedure for producing an $IrO_2$ nanowire nonwoven fabric (Example 3). First, an 8 mass % solution of PVP in methanol was subjected to electrospinning at 1 kV/cm. Thus, a nonwoven fabric made of PVP polymer nanowires having a diameter of 100 to 200 nm was prepared. FIG. 3A is a photograph of the prepared PVP nanowire nonwoven fabric. Next, an $IrO_2$ film was formed on a surface of the PVP nanowire nonwoven fabric by using a sputtering method. The $IrO_2$ film was formed by sputtering Ir in a 5% oxygen-95% argon atmosphere. FIG. 3B is a photograph of the PVP nanowire nonwoven fabric sputtered with $IrO_2$. FIG. 3C and FIG. 3D are, respectively, an SEM photograph and a schematic illustration of the PVP nanowires including the formed $IrO_2$ film. Next, the obtained nonwoven fabric was placed in a 0.5 M solution of $NaBH_4$ (solvent: a 1:1 mixture of water and ethanol) and was stirred at 80° C. for 30 minutes, thereby removing PVP. Thus, an $IrO_2$ nanowire nonwoven fabric was obtained. FIG. 3E is a photograph of the process of stirring, which was performed as a PVP removal treatment. FIG. 3F is a photograph showing a state in which the $IrO_2$ nanowire nonwoven fabric, after the PVP removal treatment, was floated in an aqueous solution. FIG. 3G is a schematic illustration of the $IrO_0$ nanowire after the PVP removal treatment. After the PVP removal treatment, the $IrO_2$ nanowire nonwoven fabric was scooped up with a Ti plate from the surface of the water. FIG. 3H is a photograph of an $IrO_2$—Ti plate obtained in this manner.

Example 4

A 4 mass % solution of PVP in methanol was subjected to electrospinning at 1 kV/cm. Thus, a nonwoven fabric made of PVP polymer nanowires having a diameter of 10 to 20 nm was prepared. Thereafter, in a manner similar to that for Example 3 except that the PVP nanowire nonwoven fabric was used as the substrate, an $IrO_2$ nanowire nonwoven fabric was obtained. This was designated as Example 4.

[Evaluation]

Figure 4A:
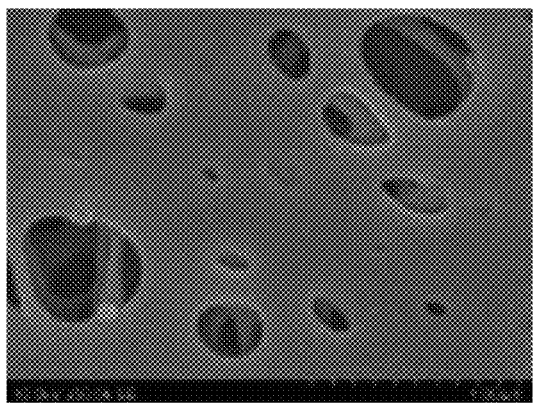
FIG. 4A to 4F show the results of examinations of Examples 1 to 3.
Figure 4B:
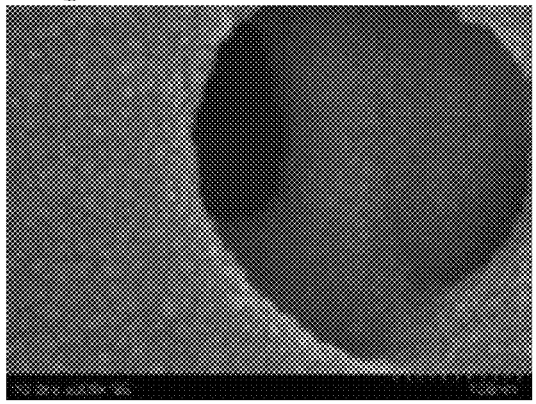
Figure 4C:
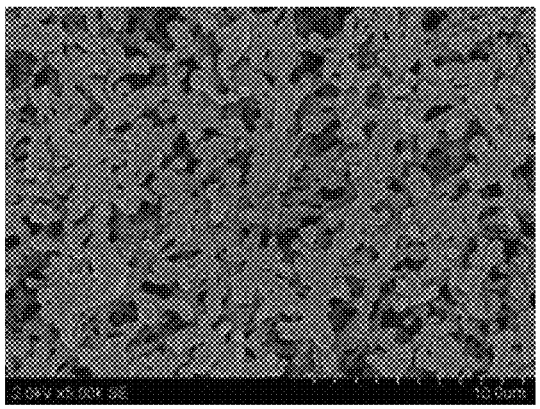
Figure 4D:
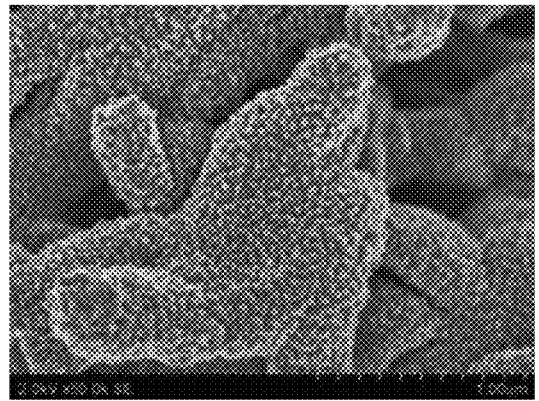
Figure 4E:
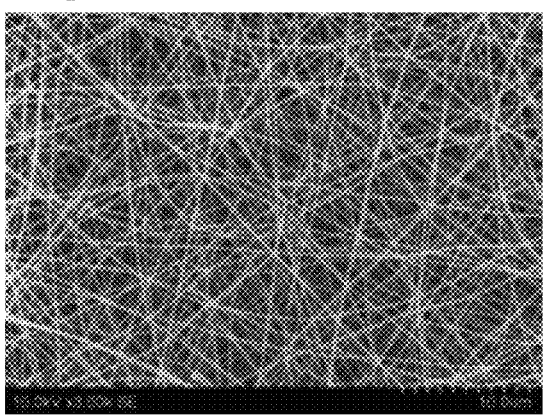
Figure 4F:
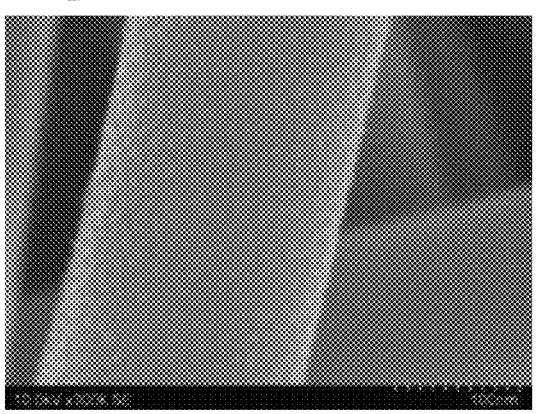

The microstructures of the produced inorganic structure bodies of Examples 1 to 4 were examined with a scanning electron microscope (an FE 5500 SEM, manufactured by Hitachi High-Technologies Corporation). FIG. 4A to 4F show the results of examinations of Examples 1 to 3. FIG. 4A is a low-magnification SEM image of Example 1, and FIG. 4B is a high-magnification SEM image of Example 1. Furthermore, FIG. 4C is a low-magnification SEM image of Example 2, and FIG. 4D is a high-magnification SEM image of Example 2. Furthermore, FIG. 4E is a low-magnification SEM image of Example 3, and FIG. 4F is a high-magnification SEM image of Example 3. FIG. 4A to FIG. 4D revealed the following. With the production method described above, flexible inorganic structure bodies made of Pt and having a free-standing structure were obtained. The inorganic structure bodies had the pore structure of the polymeric membrane filter transferred thereon without change. It was found that the inorganic structure bodies were constructed of aggregates of Pt nanoparticles having a diameter of 3 to 10 nm. Furthermore, as shown in FIG. 4E and FIG. 4F, it was found that with the production method described above, a flexible $IrO_2$ nanowire nonwoven fabric was obtained which had the nanostructure of the polymer nonwoven fabric transferred thereon without change. Furthermore, it was found that the nonwoven fabric structure formed of $IrO_2$ nanowires was constructed of aggregates of $IrO_2$ nanoparticles having a diameter of 3 to 10 nm.

Figure 5A:
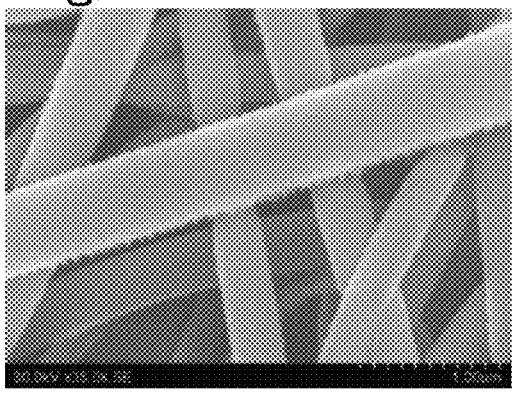
FIG. 5A to 5H shows the results of examinations of Examples 3 and 4.
Figure 5B:
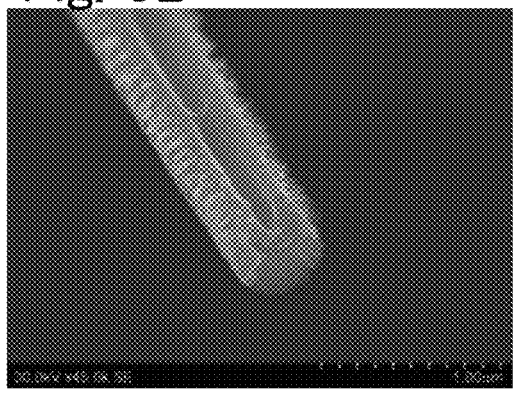
Figure 5C:
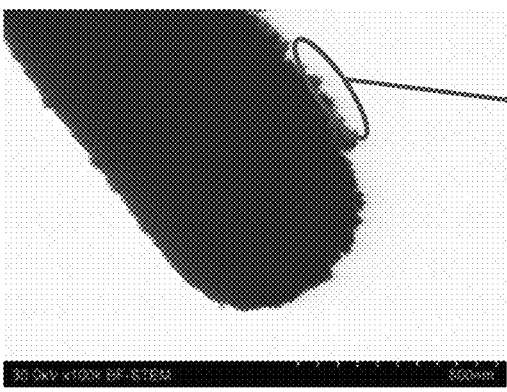
Figure 5D:
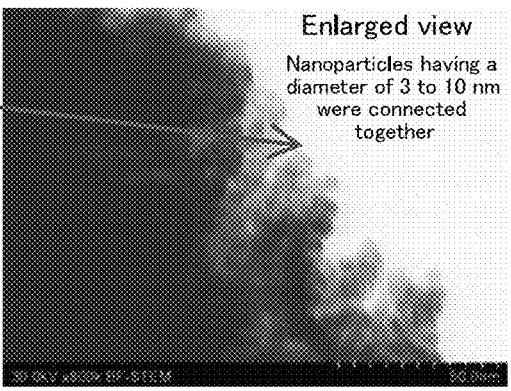
Figure 5E:
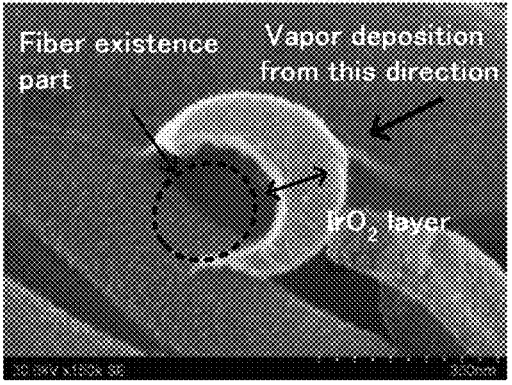
Figure 5F:
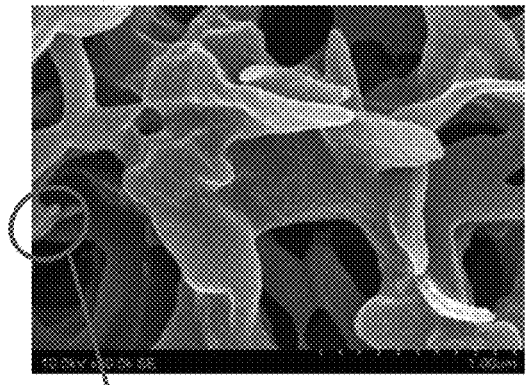
Figure 5G:
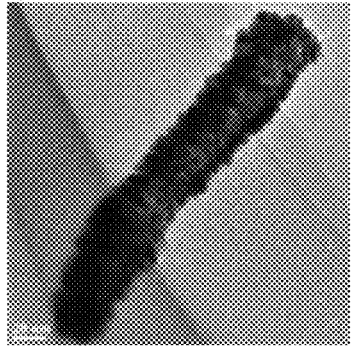
Figure 5H:
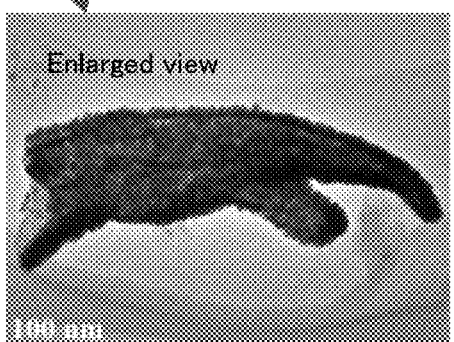

FIG. 5A to 5H show the results of examinations of Examples 3 and 4. FIG. 5A is an SEM image of the sputtered surface of the $IrO_2$ nanowire nonwoven fabric (Example 3), and FIG. 5B is an SEM image of the back surface opposite to the sputtered surface of Example 3. Furthermore, FIG. 5C is a low-magnification STEM image of Example 3, and FIG. 5D is a high-magnification STEM image (enlarged view) of Example 3. Furthermore, FIG. 5E is an SEM image of a cross section of Example 3. Furthermore, FIG. 5F is an STEM image of Example 2, FIG. 5G is an STEM image of Example 4, and FIG. 5H is a TEM image of a portion taken from FIG. 5F. FIG. 5A to FIG. 5E revealed the following. In Example 3, the $IrO_2$ nanowires had a semi-tubular form, which resulted from the fact that $IrO_2$ was sputtered on one side of the polymer nonwoven fabric (see FIGS. 5A, 5B, and 5E). Furthermore, protruding objects in which nanoparticles having a diameter of 3 to 10 nm were connected together were formed on the surface of the $IrO_2$ nanowires (see FIGS. 5C and 5D).

Furthermore, as shown in FIG. 5G, it was found that even in the case where very thin polymer nanowires having a diameter of approximately 10 to 20 nm are used as the template, the production method described above enables production of inorganic structure bodies having a nonwoven fabric structure. Furthermore, FIGS. 5F and 5H revealed the following. It was found that with the production method described above, inorganic structure bodies that have a porous membrane structure and which are constructed of Pt nanoparticles having a diameter of 3 to 10 nm can be obtained, the inorganic structure bodies having the nanostructure of the polymer membrane filter transferred thereon without change.

Examples 5 to 11

A polymer nonwoven fabric was prepared by using a small electrospinning apparatus. A metal free-standing structure was formed on a surface of the polymer nonwoven fabric by using a small desktop sputtering system (an MC 1000 ion sputtering system, manufactured by Hitachi High-Technologies Corporation). Subsequently, the polymer nonwoven fabric was removed, and thus an inorganic structure body was obtained. For the sputtering, metal targets, namely Pt, Au, Ag, Cu, Sn, Ru, and Ir targets, were used, and the obtained respective inorganic structure bodies were designated as Examples 5 to 11. The nonwoven fabric made of PVP nanofibers having a diameter of 100 to 200 nm, which was used as the template, was prepared by electrospinning a 10 mass % solution of PVP in methanol at 1 kV/cm. Sputter vapor deposition was performed on the surface by using each of the metal targets, and then the PVP nanofiber nonwoven fabric used as the template was removed by being stirred in a 0.5 M solution of $NaBH_4$ (solvent: a 1:1 mixture of water and ethanol) for 30 minutes. Note that the sputtering was performed in an inert atmosphere (Ar gas).

Figure 6:
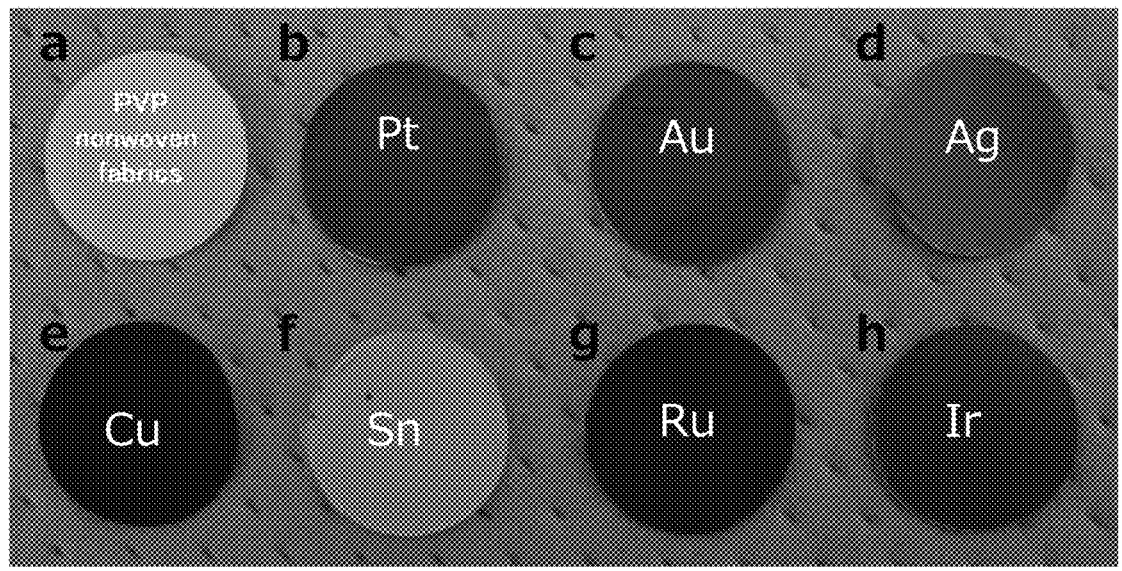
FIG. 6 is a photograph showing a nonwoven fabric, which was used as a substrate, and inorganic structure bodies of Examples 5 to 11, which were in a state before the nonwoven fabric was removed.
Figure 7:
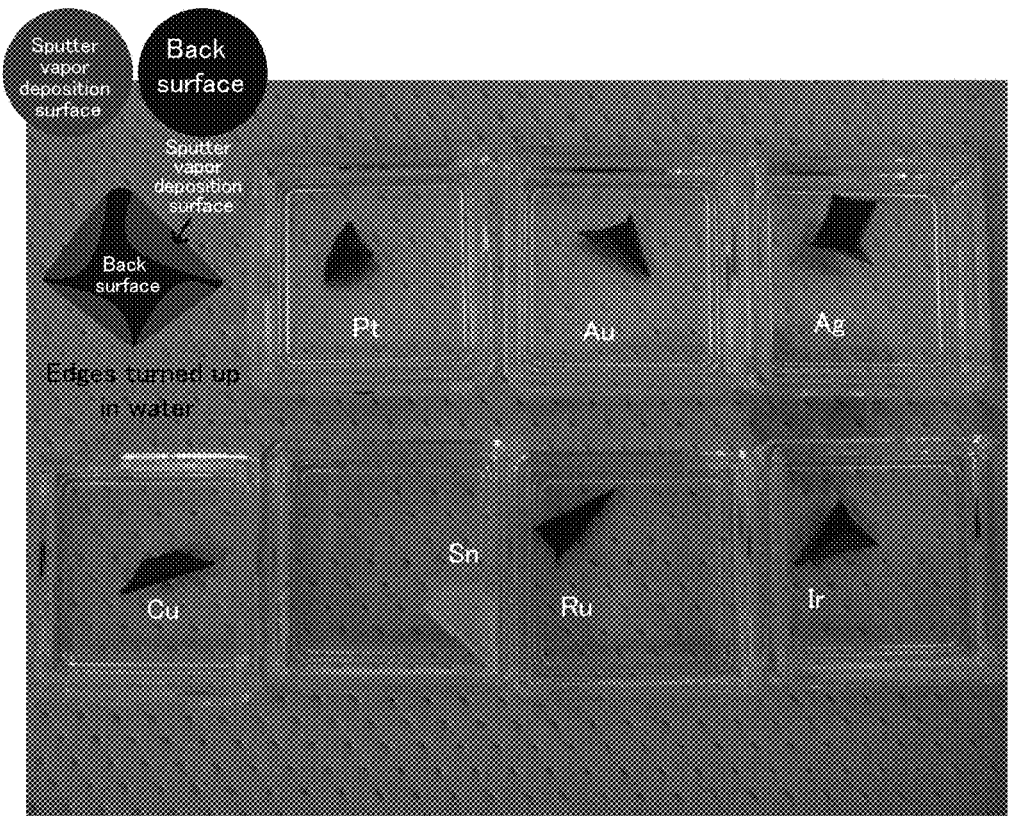
FIG. 7 is a photograph showing the inorganic structure bodies of Examples 5 to 11, which have a nonwoven fabric structure, the inorganic structure bodies being in water.
Figure 8A:
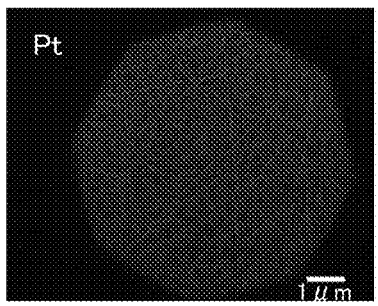
FIG. 8A to 8G present optical photomicrographs of Examples 5 to 11.
Figure 8B:
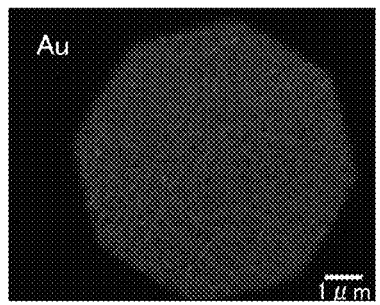
Figure 8C:
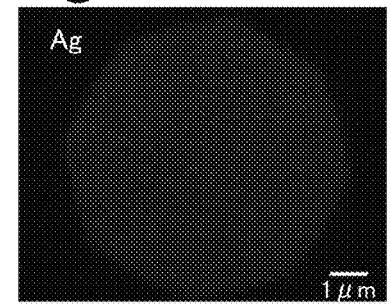
Figure 8D:
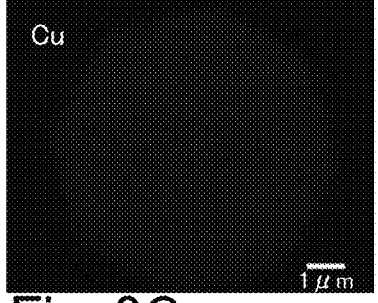
Figure 8E:
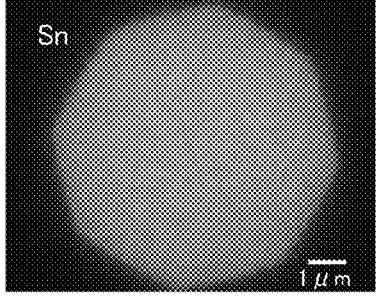
Figure 8F:
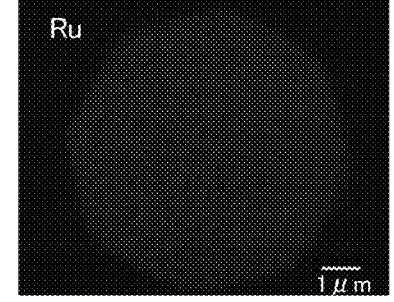
Figure 8G:
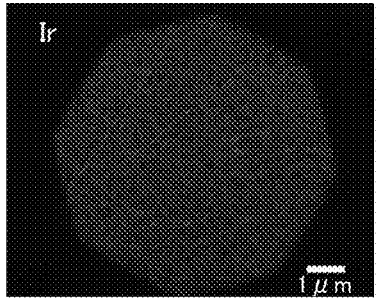

FIG. 6 is a photograph showing the nonwoven fabric used as the substrate and inorganic structure bodies of Examples 5 to 11, which were in a state before the nonwoven fabric was removed. FIG. 7 is a photograph showing the inorganic structure bodies of Examples 5 to 11, which have a nonwoven fabric structure, the inorganic structure bodies being in water. FIG. 8A to 8G present optical photomicrographs of Examples 5 to 11 (FIGS. 8A to 8G). In the photograph of FIG. 7, the inorganic structure bodies in water, with the nonwoven fabrics having been removed, are shown. The inorganic structure bodies were in a state in which a portion was turned up in water. As shown in FIG. 6 to FIGS. 8A to 8G, it was found that it is possible to produce inorganic structure bodies that are flexible and have a free-standing structure formed of a nonwoven fabric, by using any of the metals: Pt, Au, Ag, Ru, and Ir, which are noble metals, Cu, which is a transition metal, Sn, which is a main group metal, and the like. In particular, noble metals and transition metals can be used in devices that utilize their catalytic ability, and metals having high electrical conductivity (e.g., Cu and Sn) can be used in devices for electrode members, current collection members, and electrically conductive members of power storage devices and drive devices. In particular, the above-described inorganic structure bodies have a very small thickness and have flexibility and are therefore advantageous in that the inorganic structure bodies can be readily utilized in various devices.

Example 12

Figure 9A:
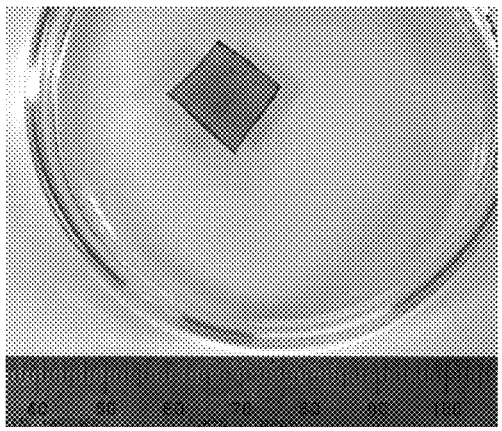
FIG. 9A to 9B present photographs showing an inorganic structure body of Example 12, which has a nonwoven fabric structure.
Figure 9B:
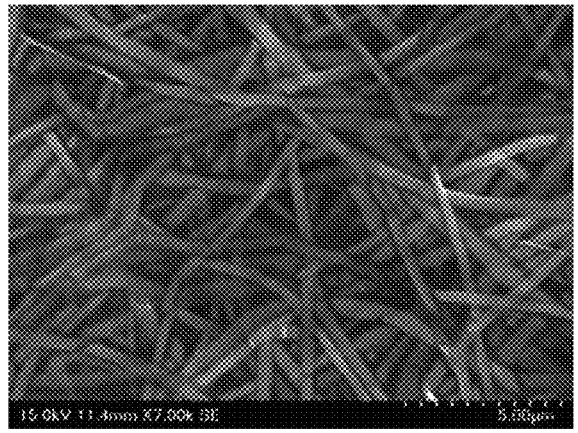

In a manner similar to that for Example 5, a Ni film was sputtered by using a Ni target to a thickness of 100 nm on a surface of a nonwoven fabric made of PVP nanofibers having a diameter of 100 to 200 nm. The vapor deposited body was immersed in an aqueous solution to obtain a Ni structure body (Ni nanostructured fabric) that was in the form of a nanowire nonwoven fabric. FIG. 9A to 9B present photographs showing the inorganic structure body of Example 12, which had a nonwoven fabric structure. FIG. 9A is a photograph showing a 10×10 mm piece of the Ni nanostructured fabric being floated in pure water. FIG. 9B is an SEM photograph of the Ni nanostructured fabric. As shown in FIG. 9A to 9B, it was found that an inorganic structure body that is flexible and has a free-standing structure formed of a nonwoven fabric can also be produced by using Ni.

(Protein Separation and Recovery Test)

Studies were conducted on performing separation and recovery of protein (peptide) by using the Ni nanostructured fabric of Example 12. Reference example 1, in which Ni nanoparticles were used, was prepared for comparison.

Figure 10A:
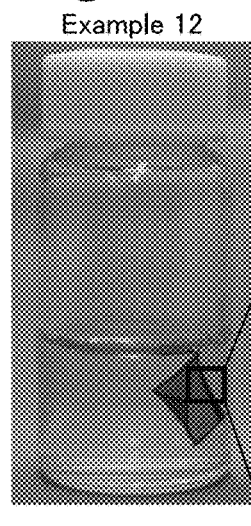
FIG. 10A to 10D present illustrations of a method for recovery of protein that uses an inorganic structure body.
Figure 10A:
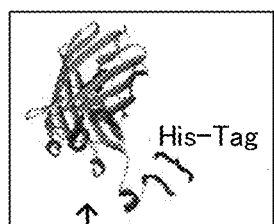
Figure 10A:
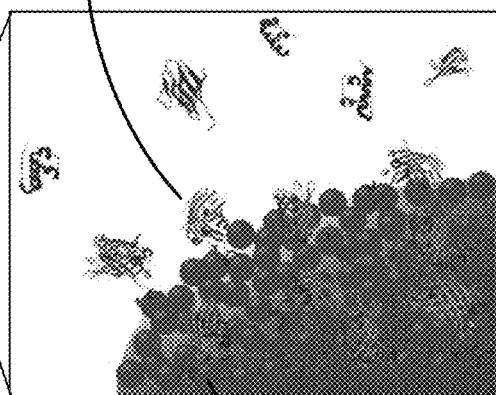
Figure 10B:
Figure 10C:
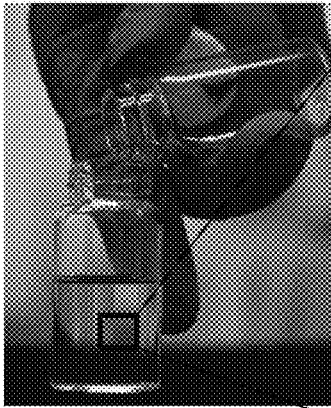
Figure 10C:
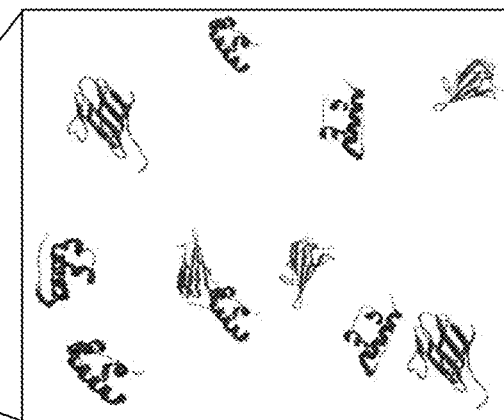
Figure 10D:
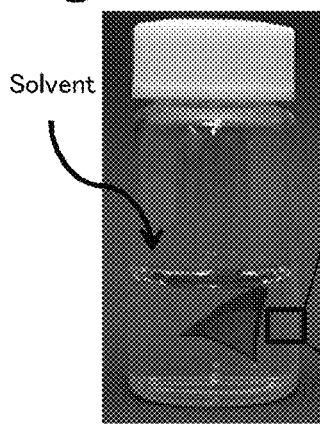
Figure 10D:
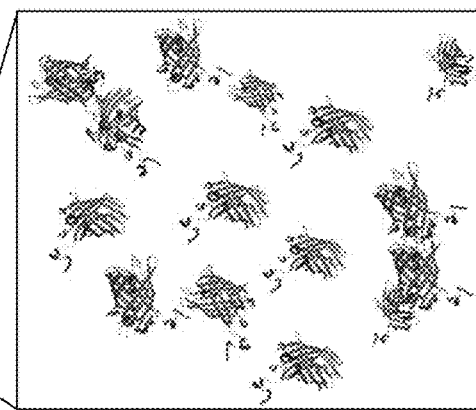
Figure 11A:
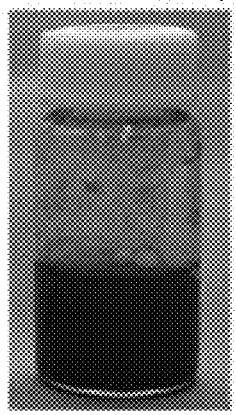
FIG. 11A to 11C present illustrations of a method for recovery of protein that uses Ni nanoparticles.
Figure 11B:
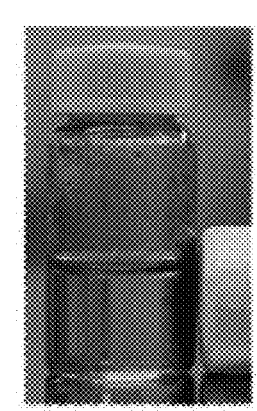
Figure 11C:
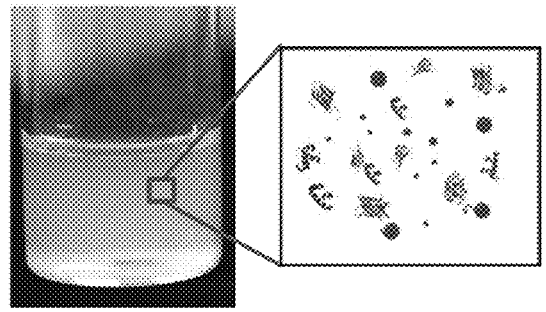

His-tagged proteins have a property of being adsorbed onto Cu, Ni, Zn, Co, or the like. This property can be utilized as follows. A metal (a structure body or particles) is added to a solution that contains proteins, and the solution is separated in a state in which the metal is excluded. Accordingly, the metal, which includes the target protein adsorbed thereon, can be separated from the solution, which contains non-target proteins. For separation and recovery of protein, a test was conducted in which a target protein with a His-tag was separated from non-target proteins without a His-tag. FIG. 10A to 10D present illustrations of a method for recovery of protein that uses the inorganic structure body (Ni nanostructured fabric). FIG. 10A shows the Ni nanostructured fabric placed in a solution containing proteins. FIG. 10B shows the Ni nanostructured fabric attracted by a magnet. FIG. 10C shows the solution containing non-target proteins being separated. FIG. 10D shows the Ni nanostructured fabric placed in a new solvent added to redissolve the target protein. FIG. 11A to 11C present illustrations of a method for recovery of protein that uses Ni nanoparticles. FIG. 11A shows the Ni nanoparticles placed in a solution containing proteins. FIG. 11B shows the Ni nanoparticles attracted by a magnet. FIG. 11C shows the solution separated as shown in FIG. 11B. As shown in FIG. 11A to 11C, in the case where Ni nanoparticles are used, the Ni nanoparticles including the target protein adsorbed thereon can be excluded by using a magnet (FIG. 11B), and accordingly, the target protein can be recovered with the Ni nanoparticles. However, the separated solution contained Ni nanoparticles that were not attracted to the magnet and therefore contained the target protein adsorbed on such nanoparticles, and as a result, sufficient separation was not achieved. In contrast, for the case where the Ni nanostructured fabric is used, the following was ascertained. First, the Ni nanostructured fabric can be withdrawn without using a magnet. In addition, the target protein can be recovered more easily and more reliably because there are no Ni nanoparticles remaining in the separated solution.

Figure 12A:
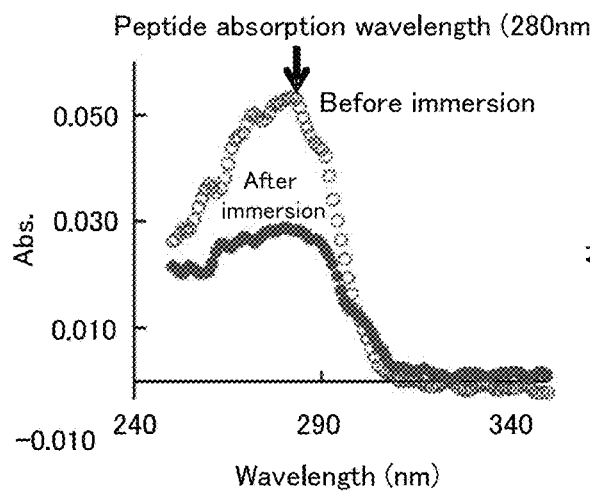
FIG. 12A to 12B present absorption spectra obtained before and after recovery of protein in cases where a His-tag was present and where no His-tag was present.
Figure 12B:
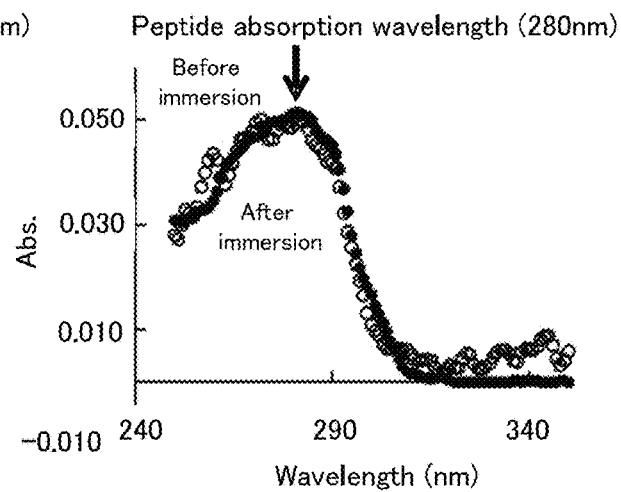

Next, separation and recovery of protein was checked. A separation and recovery test using the Ni nanostructured fabric was conducted by using a sample solution containing a His-tagged protein and a non-His-tagged protein and a sample solution containing only a non-His-tagged protein (see FIG. 10A to 10D). FIG. 12A to 12B present absorption spectra obtained before and after recovery of protein. FIG. 12A shows absorption spectra obtained in the case where the His-tagged protein was used, and FIG. 12B shows absorption spectra obtained in the case where the non-His-tagged protein was used. The measurement of absorption spectra was conducted on pre- and post-separation solutions by using a BioSpectrometer, manufactured by Eppendorf, in a wavelength range of 250 nm to 350 nm. As shown in FIG. 12B, in the solution of the non-His-tagged protein, the protein was not adsorbed onto the Ni nanostructured fabric, and therefore no change was observed in the amount of peptide absorbed in the solution. In contrast, as shown in FIG. 12A, in the solution of the His-tagged protein, since the protein was adsorbed onto the Ni nanostructured fabric, the His-tagged protein was removed from the separated solution, and as a result, the amount of peptide in the solution was reduced, and therefore the absorption spectrum showed a decrease. Thus, it became clear that target proteins can be recovered with a simple operation, that is, by immersing and removing the Ni nanostructured fabric. Furthermore, it became clear that the Ni nanostructured fabric can be utilized as a protein recovery member. Note that it was expected that not only His-tagged proteins but also proteins having a structure that can bind to a specific metal can also be separated and recovered as in this example, by using an inorganic structure body including the specific metal.

Examples 13 and 14

Figure 13:
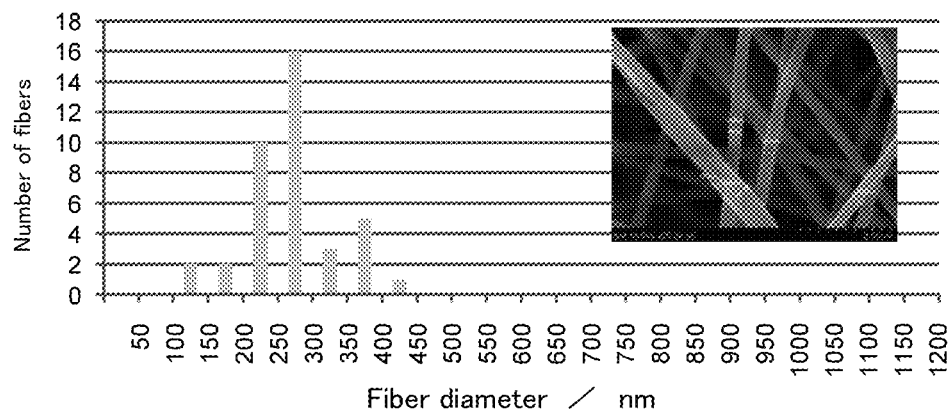
FIG. 13 presents a graph showing a fiber diameter distribution of an 8 mass % PVP nanowire nonwoven fabric and an SEM photograph thereof.
Figure 14:
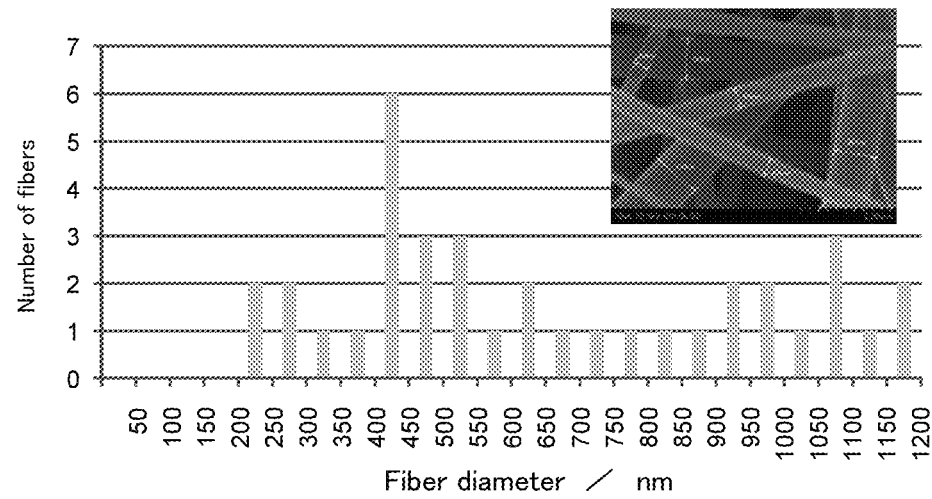
FIG. 14 presents a graph showing a fiber diameter distribution of a 16 mass % PVP nanowire nonwoven fabric and an SEM photograph thereof.

In a manner similar to that for Example 5, PVP-methanol solutions were electrospun to prepare PVP nonwoven fabrics, and then sputtering was performed by using an $IrO_2$ target. Thus, $IrO_2$ nanostructured fabrics were produced. The PVP nonwoven fabrics were obtained by electrospinning an 8 mass % solution of PVP in methanol and a 16 mass % solution of PVP in methanol, each at an electric field of 1 kV/cm and at a solution feed rate of 1 mL/h. The obtained respective $IrO_2$ nanostructured fabrics were designated as Examples 13 and 14. FIG. 13 presents a graph showing a fiber diameter distribution of the 8 mass % PVP nanowire nonwoven fabric, which was produced for electrolysis of water, and an SEM photograph thereof. FIG. 14 presents a graph showing a fiber diameter distribution of the 16 mass % PVP nanowire nonwoven fabric, which was produced for electrolysis of water, and an SEM photograph thereof. With the 8 mass % solution of PVP in methanol, a nonwoven fabric having an average fiber diameter of approximately 300 nm and having the fiber diameter distribution shown in FIG. 13 was obtained. Furthermore, with the 16 mass % solution of PVP in methanol, a nonwoven fabric having an average fiber diameter of approximately 500 nm and having the fiber diameter distribution shown in FIG. 14 was obtained.

(Water Electrolysis Test)

Studies were conducted on a water electrolysis process in which the $IrO_2$ nanostructured fabrics of Examples 13 and 14 were used. Comparative Example 1, in which bulk iridium metal was used, was prepared for comparison.

Figure 15:
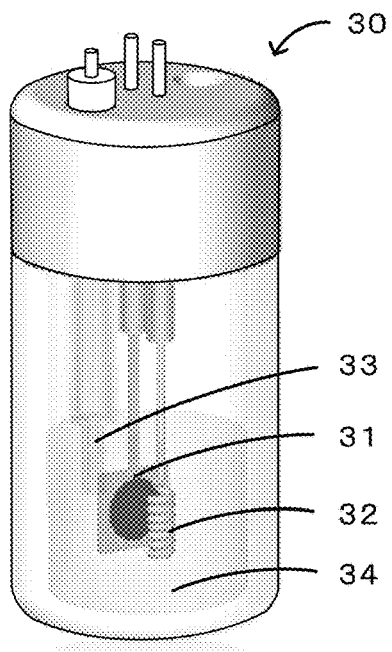
FIG. 15 is a diagram illustrating an electrolysis cell 30, which is used in a water electrolysis test.
Figure 16:
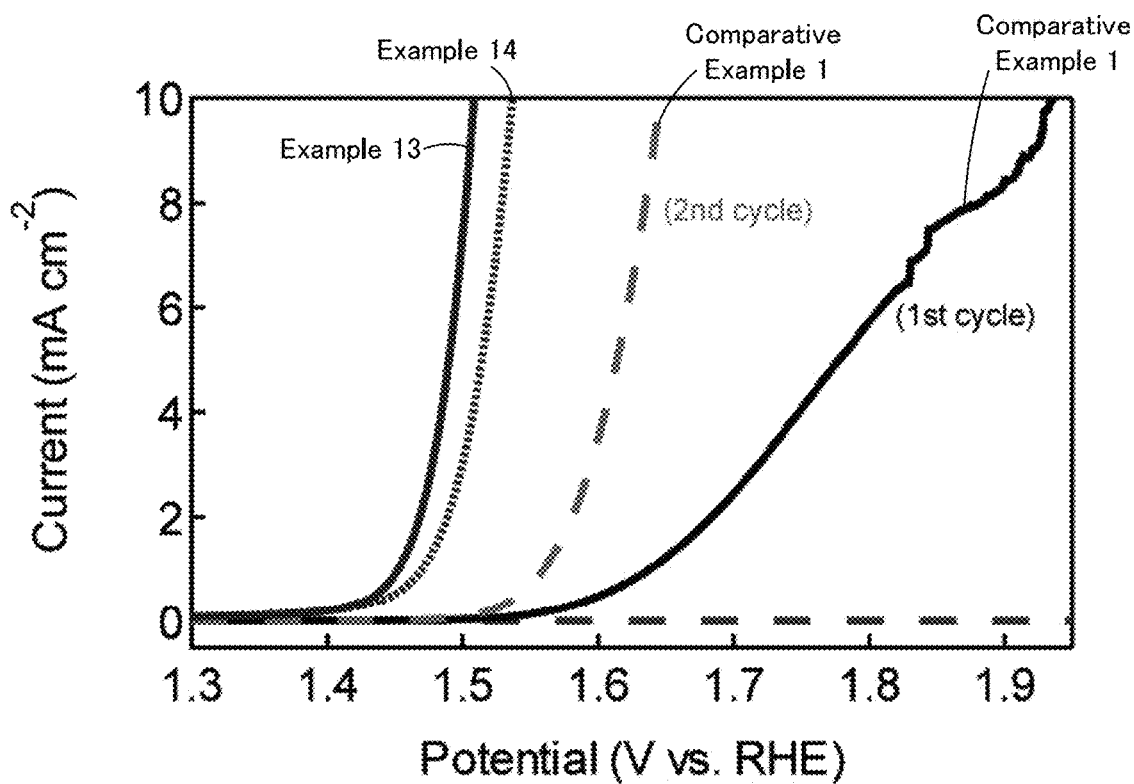
FIG. 16 shows polarization curves associated with oxygen evolution reactions of Examples 13 and 14 and Comparative Example 1.

A water electrolysis test was conducted using an electrolysis cell 30, illustrated in FIG. 15. The electrolysis cell 30 includes a working electrode 31, a counter electrode 32, a reference electrode 33, and a container 34 for storing an electrolyte solution. The working electrode 31 included a Ti plate that included the iridium oxide nanostructured fabric transferred thereon (Examples 13 and 14), or the working electrode 31 included bulk iridium metal (Comparative Example 1). The counter electrode 32 was formed of a Pt coil wire. The reference electrode 33 was a reversible hydrogen electrode (RHE). The container 34 was filled with a 0.5 M aqueous solution of $H_2SO_4$. For the working electrode 31, the amount of iridium included in the iridium oxide nanostructured fabric, a dense film, and the iridium metal (bulk) was 100 μg/cm². The electrolysis cell 30 was used to investigate oxygen evolution catalytic performance by performing a sweep at a potential sweep rate of 5 mV/sec with the reversible hydrogen electrode used as the reference. FIG. 16 shows polarization curves associated with oxygen evolution reactions of Examples 13 and 14 and Comparative Example 1. The plot was made with ohmic resistance taken into account. With the Ir metal of Comparative Example 1, the potential at 10 mA/cm² exceeded 1.6 V, as shown in FIG. 16. In contrast, in Examples 13 and 14, in which the iridium oxide nanostructured fabrics were used, the potentials at 10 mA/cm² were 1.50 V and 1.54 V, respectively, which indicated that high catalytic activities were achieved. Thus, it was found that the nanostructured fabrics reduce the potential for electrolysis of water and have higher catalytic activity than the dense film, which has a relatively good catalytic activity.

Examples 15 to 17

A PVP nonwoven fabric prepared by electrospinning an 8 mass % solution of PVP in methanol was used as the substrate, and in a manner similar to that for Example 5, a Cu nanostructured fabric, a Ag nanostructured fabric, and a Ag—Cu nanostructured fabric were produced and respectively designated as Examples 15 to 17. In Example 17, Ag was formed on the PVP nonwoven fabric by using a Ag target, and thereafter Cu was formed on Ag, which was formed earlier, by using a Cu target, and this process was performed three times (three-layer structure).

(Evaluation of Light Absorption Characteristics)

Figure 17:
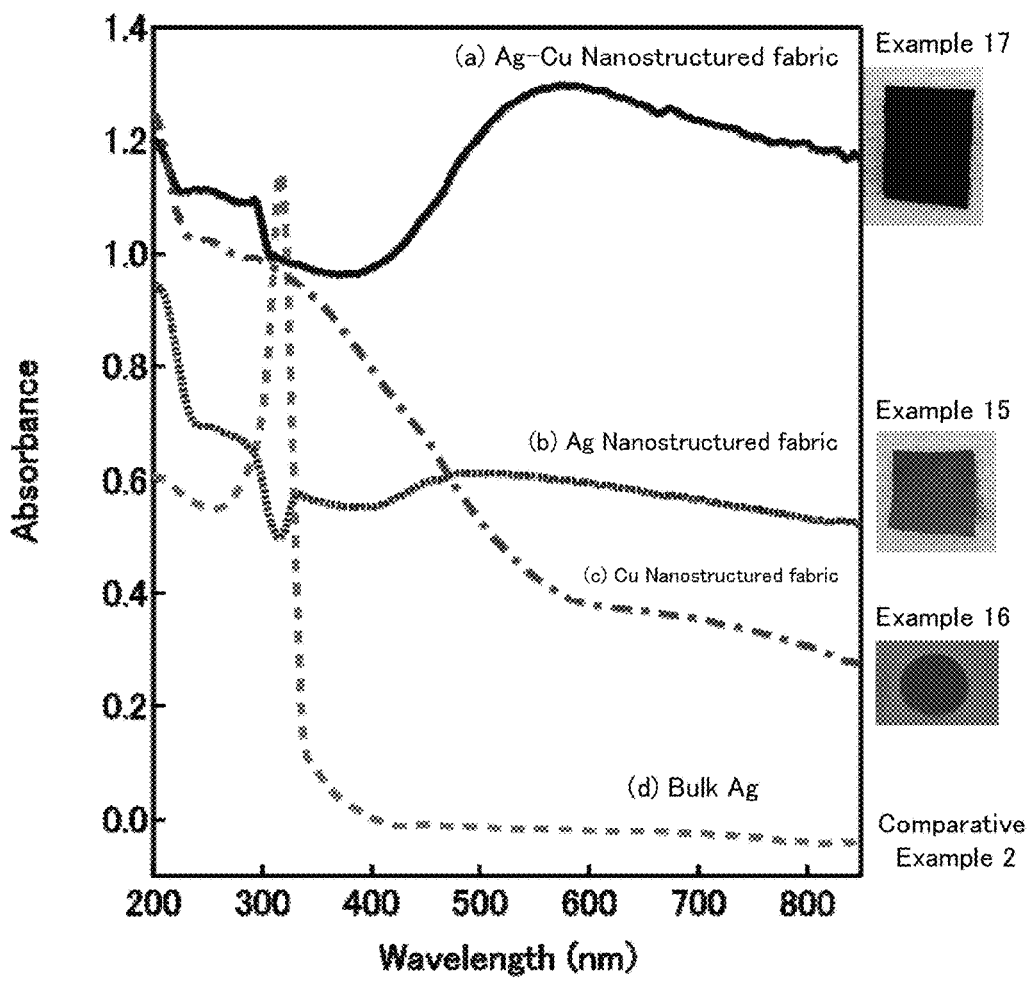
FIG. 17 shows UV-vis spectra of Examples 15 to 17 and Comparative Example 2.

The light absorption characteristics of the nanostructured fabrics of Examples 15 to 17 were evaluated. Comparative Example 2, in which bulk Ag metal was used, was prepared for comparison. Light absorption characteristics were evaluated by measuring the samples with a UV-3600 UV-VIS-NIR spectrophotometer with an ISR-3100, manufactured by Shimadzu Corporation, in a wavelength range of 200 nm to 850 nm. FIG. 17 shows UV-vis spectra of Examples 15 to 17 and Comparative Example 2. In FIG. 17, photographs of the structured fabrics are also shown. As shown in FIG. 17, the nanostructured fabrics of Examples 15 to 17 exhibited high absorbance compared with the bulk Ag metal of Comparative Example 2, which made it clear that light absorption characteristics were improved. In particular, the Ag—Cu nanostructured fabric of Example 17, which was produced by stacking layers of Ag and Cu, exhibited particularly high absorbance.

(Evaluation of Photothermal Conversion Characteristics)

Figure 18:
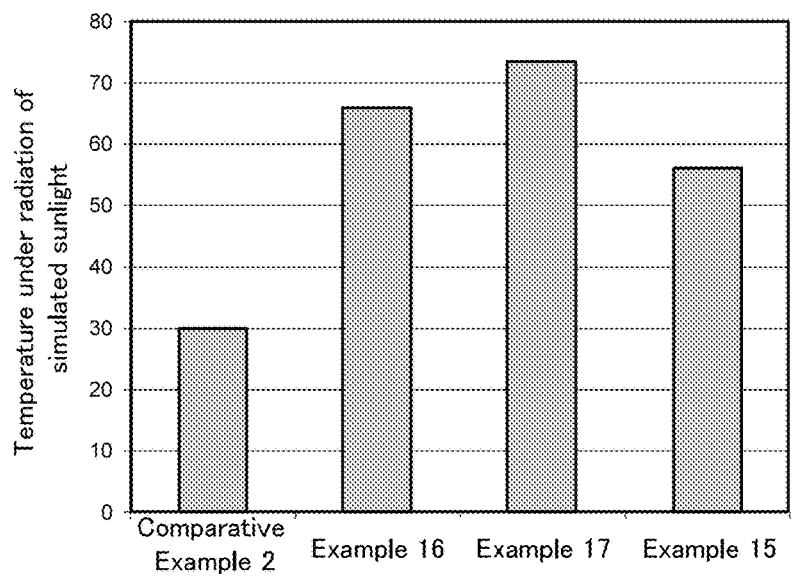
FIG. 18 shows the results of temperature measurements of Examples 15 to 17 and Comparative Example 2, which were conducted with radiation of simulated sunlight.

Next, Examples 15 to 17 and Comparative Example 2 were evaluated for photothermal conversion characteristics, which are characteristics for converting absorbed light to heat. The evaluations of photothermal conversion characteristics were made by measuring temperatures of the nanostructured fabrics of Examples 15 to 17 and the bulk Ag of Comparative Example 2 with a K-type thermocouple. The temperatures are temperatures reached when simulated sunlight was radiated to the nanostructured fabrics. The simulated sunlight was radiated at a light intensity of 1 $kW \cdot m^{-2}$ by using a solar simulator (HAL-302) manufactured by Asahi Spectra. FIG. 18 shows the results of temperature measurements of Examples 15 to 17 and Comparative Example 2, which were conducted with radiation of simulated sunlight. The measurement result of Comparative Example 2 was 30° C., and the measurement results of Examples 15 to 17 were 55° C., 65° ° C., and 73° C., respectively. As shown in FIG. 18, the Ag nanostructured fabric, the Cu nanostructured fabric, and the Ag—Cu nanostructured fabric had higher temperatures than the bulk Ag, with the Ag—Cu nanostructured fabric heated to 73° C. by radiation of sunlight. Thus, it became clear that the nanostructured fabrics have higher photothermal conversion characteristics.

(Measurement of Water Evaporation Rate)

Figure 19:
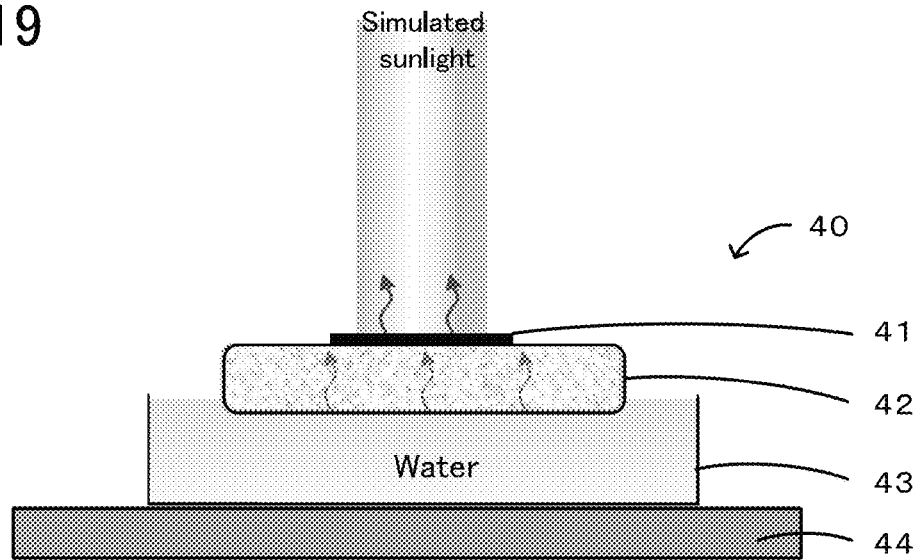
FIG. 19 is a diagram illustrating a water evaporation rate meter.
Figure 20:
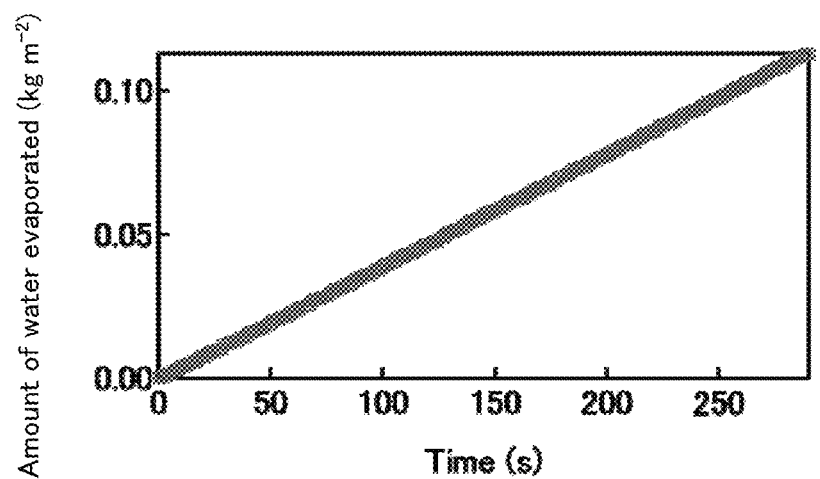
FIG. 20 is a graph associated with Example 17, illustrating a relationship between the amount of water evaporated and time.

A water evaporation rate was measured using an evaporimeter 40, illustrated in FIG. 19. The evaporimeter 40 includes a nanostructured fabric 41, a support body 42, a container 43, and a balance 44. The nanostructured fabric 41 contains one or more of Ag and Cu. The nanostructured fabric 41 is a photothermal conversion member that absorbs light and converts the light to heat. The support body 42 is a component having water absorbing properties and thermal insulation properties. A first surface of the support body 42 is in contact with the nanostructured fabric 41, and a second surface of the support body 42 is in contact with a liquid stored in the container 43. In this case, the support body 42 is a styrofoam body. The container 43 is a receptacle having an open upper end and is configured to store liquid (water). The container 43 is disposed on the balance 44. The mass of the container 43 can be measured with the balance 44. The balance 44 is an XSE205DUV, manufactured by Mettler Toledo. When light is radiated onto the nanostructured fabric 41 of the evaporimeter 40, the nanostructured fabric 41 converts the light to heat, thereby evaporating water supplied from the support body 42. In the evaporimeter 40, the amount of water evaporated can be measured by measuring the mass over time by using the balance 44. FIG. 20 is a graph associated with Example 17, which is a Ag—Cu nanostructured fabric. FIG. 20 illustrates a relationship between the amount of water evaporated and time. In Example 17, an evaporation rate of 1.4 $kg \cdot m^{-2} h^{-1}$ was achieved. This evaporation rate is higher than an evaporation rate of 1 $kg \cdot m^{-2} h^{-1}$ achieved with radiation of sunlight at an intensity of 1 $kW \cdot m^{-2}$ (1 sun), which is described in documents reported in the past (Sci. Adv. 8 Apr. 2016, Vol. 2, No. 4, e1501227, Nature Communications volume 5, Article number: 4449 (2014), Adv. Energy Materials, Vol. 8, Issue 4, Feb. 5, 2018, 1701028, and Nature Photonics volume 10, pages 393-398 (2016)). Furthermore, assuming that all of the radiated sunlight is utilized for evaporation of water, the theoretical evaporation rate as calculated is 1.39 to 1.47 $kg \cdot m^{-2} h^{-1}$. It became clear that the Ag—Cu nanostructured fabric has high photothermal conversion characteristics.

Although examples of the present disclosure have been described in detail in the foregoing description, the present disclosure is in no way limited to the examples described above, and various modifications may be made without departing from the gist of the present disclosure.

The present application is based upon and claims the benefit of priority from Japanese Patent Application No. 2017-172342, filed Sep. 7, 2017 and Japanese Patent Application No. 2018-72715, filed Apr. 4, 2018, the entire contents of which are incorporated herein by reference.

INDUSTRIAL APPLICABILITY

The inorganic structure body, the device, and the method for manufacturing the inorganic structure body of the present disclosure can be employed for catalyst layers, filters, and electrically conductive members of various devices.

REFERENCE SIGNS LIST

20 Inorganic structure body, 21 Fibrous member, 22 Substrate space, 23 Protruding structure, 24 Nanoparticles, 30 Electrolysis cell, 31 Working electrode, 32 Counter electrode, 33 Reference electrode, 34 Container, 40 Evaporimeter, 41 Nanostructured fabric, 42 Support body, 43 Container, 44 Balance

The invention claimed is:

1. An inorganic structure body comprising a free-standing structure including at least one of a fibrous member and a shell, the at least one of the fibrous member and the shell including at least one of a metal and an inorganic material and having a three-dimensionally continuous configuration,
    wherein the free-standing structure is a nonwoven fabric structure having flexibility, the nonwoven fabric structure including a semi-tubular nanowire that has a three-dimensionally continuous configuration, and
    wherein the free-standing structure contains at least one of Pt, Au, Ag, Ru, Ir, Cu, Sn, Ni, Cr, and Zn.

2. The inorganic structure body according to claim 1, wherein the free-standing structure includes at least one of the following (a) to (d):
   (a) metal nanoparticles containing one of a noble metal, a main group metal, and a transition metal;
   (b) metal nanoparticles made of an alloy containing at least one of a noble metal, a main group metal, and a transition metal;
   (c) metal compound nanoparticles made of a metal oxide, a metal sulfide, a metal nitride, a metal carbide, a metal phosphide, or a metal iodide; and
   (d) carbon nanoparticles.

3. The inorganic structure body according to claim 1, wherein the free-standing structure includes, on a surface of the free-standing structure, protruding structures that include the at least one of the metal and the inorganic material and which have a diameter of 3 nm or greater and 10 nm or less.

4. The inorganic structure body according to claim 1, further comprising a support portion made of a polymer, the support portion supporting at least a portion of the free-standing structure.

5. A device in which the inorganic structure body according to claim 1 is used as at least one of a catalyst layer, a filter, and an electrically conductive member.

6. A device comprising the inorganic structure body according to claim 1, the inorganic structure body serving as a recovery member that selectively recovers a protein.

7. The device according to claim 6, wherein the inorganic structure body contains at least one of Cu, Ni, Zn, and Co and selectively recovers a His-tagged protein.

8. A device comprising the inorganic structure body according to claim 1, the inorganic structure body serving as a catalyst member for electrolysis of water.

9. The device according to claim 8, wherein the inorganic structure body contains at least one of Pt, Au, Ag, Ru, and Ir and has an average diameter of 200 nm or greater and 800 nm or less.

10. A device comprising the inorganic structure body according to claim 1, the inorganic structure body serving as a photothermal conversion member that absorbs light and converts the light to heat.

11. The device according to claim 10, wherein the inorganic structure body contains at least one of Ag and Cu.

12. A device comprising an inorganic structure body comprising a free-standing structure including at least one of a fibrous member and a shell, the at least one of the fibrous member and the shell including at least one of a metal and an inorganic material and having a three-dimensionally continuous configuration, the inorganic structure body serving as a photothermal conversion member that absorbs light and converts the light to heat, the device further comprising a support body that has a water absorbing property and a thermal insulation property, a first surface of the support body being in contact with the inorganic structure body, a second surface of the support body being in contact with a liquid, the device being configured to evaporate the liquid by using the heat converted by the inorganic structure body.

13. A method for manufacturing an inorganic structure body, the method comprising:
   a forming step of forming at least one of a metal and an inorganic material on a surface of a substrate including a polymer, thereby forming, on the surface of the substrate, a free-standing structure that includes at least one of a fibrous member and a shell, the at least one of the fibrous member and the shell including the at least one of the metal and the inorganic material and having a three-dimensionally continuous configuration, wherein, in the forming step, the at least one of the metal and the inorganic material is physically vapor deposited onto only one side of the substrate and wherein, in the forming step, at least one of Pt, Au, Ag, Ru, Ir, Cu, Sn, Ni, Cr, and Zn is used as the metal; and
   a removing step of removing all or a portion of the substrate to achieve the inorganic structure body that is nonwoven fabric structure having flexibility, the nonwoven fabric structure including a semi-tubular nanowire that has a three-dimensionally continuous configuration.

14. The method for manufacturing an inorganic structure body according to claim 13, wherein, in the removing step, a support portion is formed by removing a portion of the substrate, the support portion being to support at least a portion of the free-standing structure that includes the at least one of the fibrous member and the shell, the at least one of the fibrous member and the shell including the at least one of the metal and the inorganic material and having the three-dimensionally continuous configuration.

15. The method for manufacturing an inorganic structure body according to claim 13, wherein, in the forming step, at least one of Cu, Ni, Zn, and Co is used as the metal to produce the inorganic structure body, the inorganic structure body being to selectively recover a His-tagged protein.

16. The method for manufacturing an inorganic structure body according to claim 13, wherein, in the forming step and the removing step, the inorganic structure body is produced, the inorganic structure body containing at least one of Pt, Au, Ag, Ru, and Ir and having an average diameter of 200 nm or greater and 800 nm or less, the inorganic structure body being to serve as a catalyst member for electrolysis of water.

17. The method for manufacturing an inorganic structure body according to claim 13, wherein, in the forming step and the removing step, the inorganic structure body is produced, the inorganic structure body containing at least one of Ag and Cu, the inorganic structure body being to serve as a photothermal conversion member that absorbs light and converts the light to heat.

* * * * *